(12) United States Patent
Kidoh et al.

(10) Patent No.: US 8,264,031 B2
(45) Date of Patent: Sep. 11, 2012

(54) NONVOLATILE SEMICONDUCTOR MEMORY DEVICE AND METHOD FOR MANUFACTURING SAME

(75) Inventors: Masaru Kidoh, Tokyo (JP); Hiroyasu Tanaka, Tokyo (JP); Tomoko Fujiwara, Kanagawa-ken (JP); Megumi Ishiduki, Kanagawa-ken (JP); Yosuke Komori, Kanagawa-ken (JP); Masaru Kito, Kanagawa-ken (JP); Yoshiaki Fukuzumi, Kanagawa-ken (JP); Ryota Katsumata, Kanagawa-ken (JP); Ryouhei Kirisawa, Kanagawa-ken (JP); Junya Matsunami, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 12/696,544

(22) Filed: Jan. 29, 2010

(65) Prior Publication Data

US 2010/0200906 A1 Aug. 12, 2010

(30) Foreign Application Priority Data

Feb. 6, 2009 (JP) ................................. 2009-026395

(51) Int. Cl.
*H01L 29/792* (2006.01)
(52) U.S. Cl. ............. 257/326; 257/315; 257/E27.102
(58) Field of Classification Search ........................ None
See application file for complete search history.

(56) References Cited

U.S. PATENT DOCUMENTS

| | | | |
|---|---|---|---|
| 6,885,044 B2 * | 4/2005 | Ding | 257/202 |
| 2002/0012745 A1 * | 1/2002 | Kanamori | 427/96 |
| 2007/0252201 A1 | 11/2007 | Kito et al. | |
| 2008/0048245 A1 * | 2/2008 | Kito et al. | 257/321 |
| 2009/0321813 A1 | 12/2009 | Kidoh et al. | |

FOREIGN PATENT DOCUMENTS

JP 2007-266143 10/2007
WO WO 2009/075370 A1 6/2009

\* cited by examiner

*Primary Examiner* — Fei Fei Yeung Lopez
(74) *Attorney, Agent, or Firm* — Oblon, Spivak, McClelland, Maier & Neustadt, L.L.P.

(57) ABSTRACT

A nonvolatile semiconductor memory device includes: a semiconductor substrate; a multilayer structure; a semiconductor pillar; a third insulating film; and a fourth insulating film layer. The a multilayer structure is provided on the semiconductor substrate and including a plurality of constituent multilayer bodies stacked in a first direction perpendicular to a major surface of the semiconductor substrate. Each of the plurality of constituent multilayer bodies includes an electrode film provided parallel to the major surface, a first insulating film, a charge storage layer provided between the electrode film and the first insulating film, and a second insulating film provided between the charge storage layer and the electrode film. The semiconductor pillar penetrates through the multilayer structure in the first direction. The third insulating film is provided between the semiconductor pillar and the electrode film. The fourth insulating film is provided between the semiconductor pillar and the charge storage layer.

16 Claims, 21 Drawing Sheets

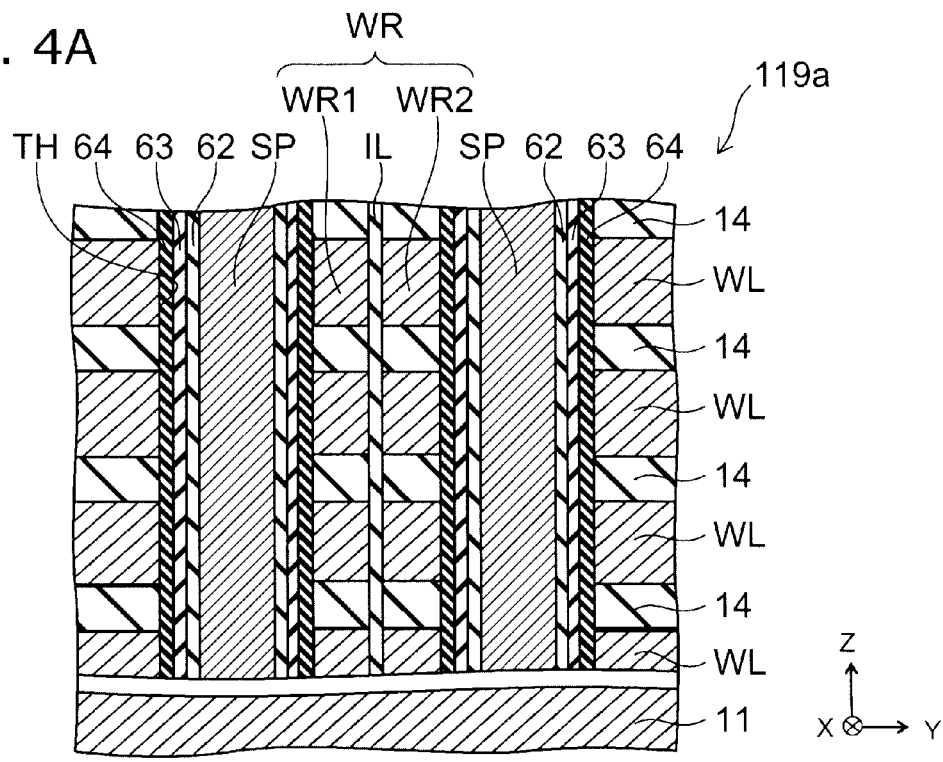
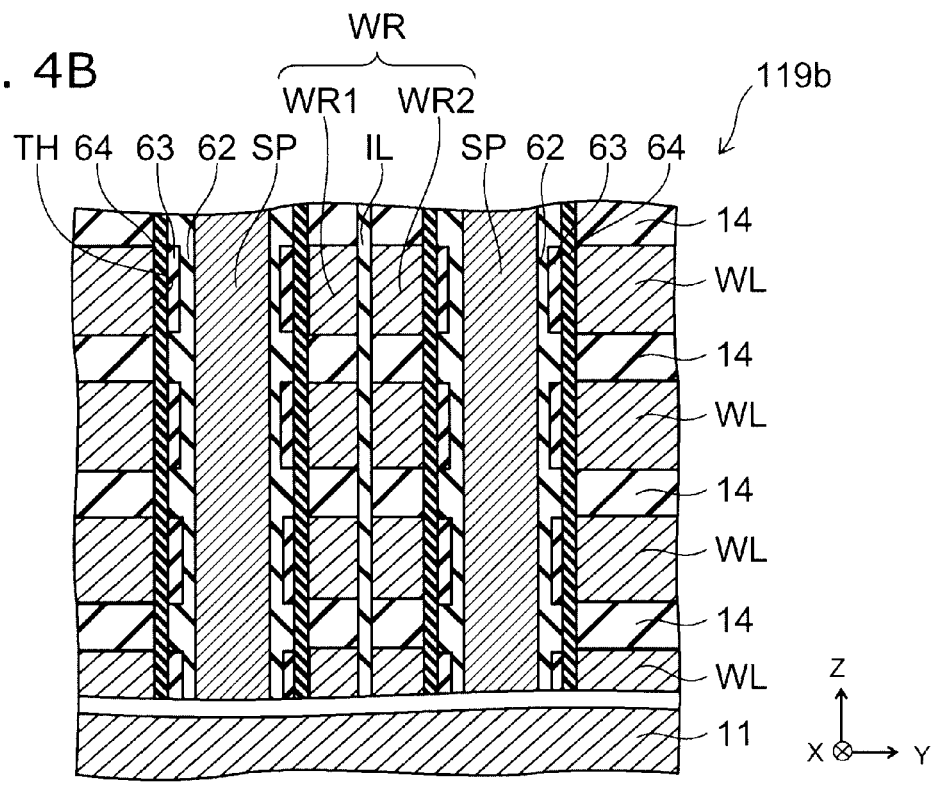

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-026395, filed on Feb. 6, 2009; the entire contents of which are incorporated herein by reference.

BACKGROUND OF THE INVENTION

1. Field of the Invention

This invention relates to a nonvolatile semiconductor memory device and a method for manufacturing the same.

2. Background Art

Conventionally, nonvolatile semiconductor memory devices such as flash memories have been fabricated by two-dimensionally integrating elements on the surface of a silicon substrate. Increasing the memory capacity of such a flash memory needs to rely on downscaling by decreasing the dimensions of each element. However, such downscaling has recently been difficult in terms of cost and technology.

To solve this problem, numerous methods for three-dimensionally integrating elements are proposed. Among them, a simultaneously processed three-dimensional multilayer memory having high productivity is promising (see JP-A 2007-266143 (Kokai)). In this technique, electrode films and insulating films are alternately stacked on a silicon substrate to form a multilayer body, and then through holes are simultaneously formed in this multilayer body. A charge storage layer is formed on the side surface of the through hole, and silicon is buried inside the through hole to form a silicon pillar. Thus, a memory cell is formed at each intersection between the electrode film and the silicon pillar. Furthermore, the end portion of the multilayer body is processed into a staircase shape, an interlayer insulating film is provided around the multilayer body so as to overlap the staircase-shaped end portion, and contacts are buried in the interlayer insulating film so as to be connected to the end portions of the electrode films. A plurality of metal interconnects are provided above the interlayer insulating film and connected to the end portions of the electrode films through the contacts. Thus, the potential of each electrode film can be independently controlled through the metal interconnect and the contact.

In this simultaneously processed three-dimensional multilayer memory, information can be recorded by controlling the potential of each electrode film and each silicon pillar to transfer charge between the silicon pillar and the charge storage layer. In this technique, a plurality of electrode films are stacked on the silicon substrate to reduce the chip area per bit, and it allows cost reduction. Furthermore, because the multilayer body can be simultaneously processed to form a three-dimensional multilayer memory, increase in the number of stacked films does not result in increasing the number of lithography steps, and cost increase can be suppressed.

In this simultaneously processed three-dimensional multilayer memory, three layers of a tunnel insulating film, a charge storage layer, and a block insulating film are provided inside the through hole. This restricts reduction of the diameter of the through hole, and there is room for improvement for higher density packaging.

SUMMARY OF THE INVENTION

According to an aspect of the invention, there is provided a nonvolatile semiconductor memory device including: a semiconductor substrate; a multilayer structure provided on the semiconductor substrate and including a plurality of constituent multilayer bodies stacked in a first direction perpendicular to a major surface of the semiconductor substrate, each of the plurality of constituent multilayer bodies including an electrode film provided parallel to the major surface, a first insulating film, a charge storage layer provided between the electrode film and the first insulating film, and a second insulating film provided between the charge storage layer and the electrode film; a semiconductor pillar penetrating through the multilayer structure in the first direction; a third insulating film provided between the semiconductor pillar and the electrode film; and a fourth insulating film provided between the semiconductor pillar and the charge storage layer.

According to another aspect of the invention, there is provided a method for manufacturing a nonvolatile semiconductor memory device, including: forming a multilayer structure on a major surface of a substrate by stacking a constituent multilayer body multiple times, the constituent multilayer body including an electrode film, a first insulating film, a second insulating film, and a charge storage layer, the forming the multilayer structure being performed on the major surface of the substrate and repeating forming the constituent multilayer body multiple times, the forming the constituent multilayer body including stacking the electrode film, stacking the first insulating film, stacking the charge storage layer performed between the stacking the electrode film and the stacking the first insulating film, and stacking the second insulating film performed between the stacking the electrode film and the stacking the charge storage layer; forming a through hole penetrating through the multilayer structure in a first direction perpendicular to the major surface; forming a third insulating film by oxidizing the electrode film exposed to an inner surface of the through hole; forming a fourth insulating film on an inner wall of the through hole; and forming a semiconductor pillar by burying a semiconductor material in a remaining space inside the through hole.

BRIEF DESCRIPTION OF THE DRAWINGS

FIGS. 4A and 4B are schematic cross-sectional views illustrating the configuration of a nonvolatile semiconductor memory device of comparative examples;

DETAILED DESCRIPTION OF THE INVENTION

Figure 1:
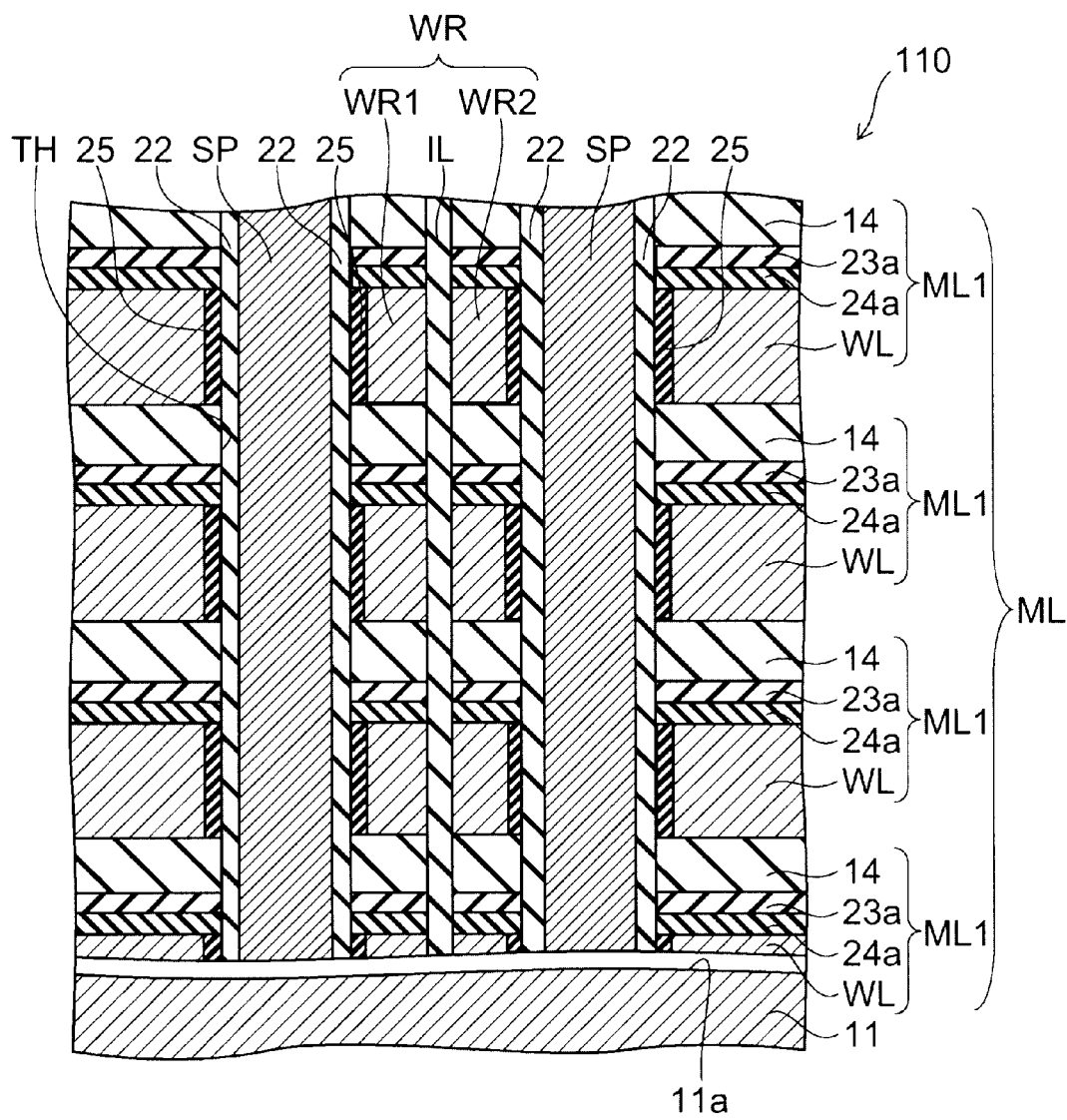
FIG. 1 is a schematic cross-sectional view illustrating the configuration of a nonvolatile semiconductor memory device according to a first embodiment of the invention.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, the same elements as those described previously with reference to earlier figures are labeled with like reference numerals, and the detailed description thereof is omitted as appropriate.

First Embodiment

FIG. 1 is a schematic cross-sectional view illustrating the configuration of a nonvolatile semiconductor memory device according to a first embodiment of the invention.

Figure 2:
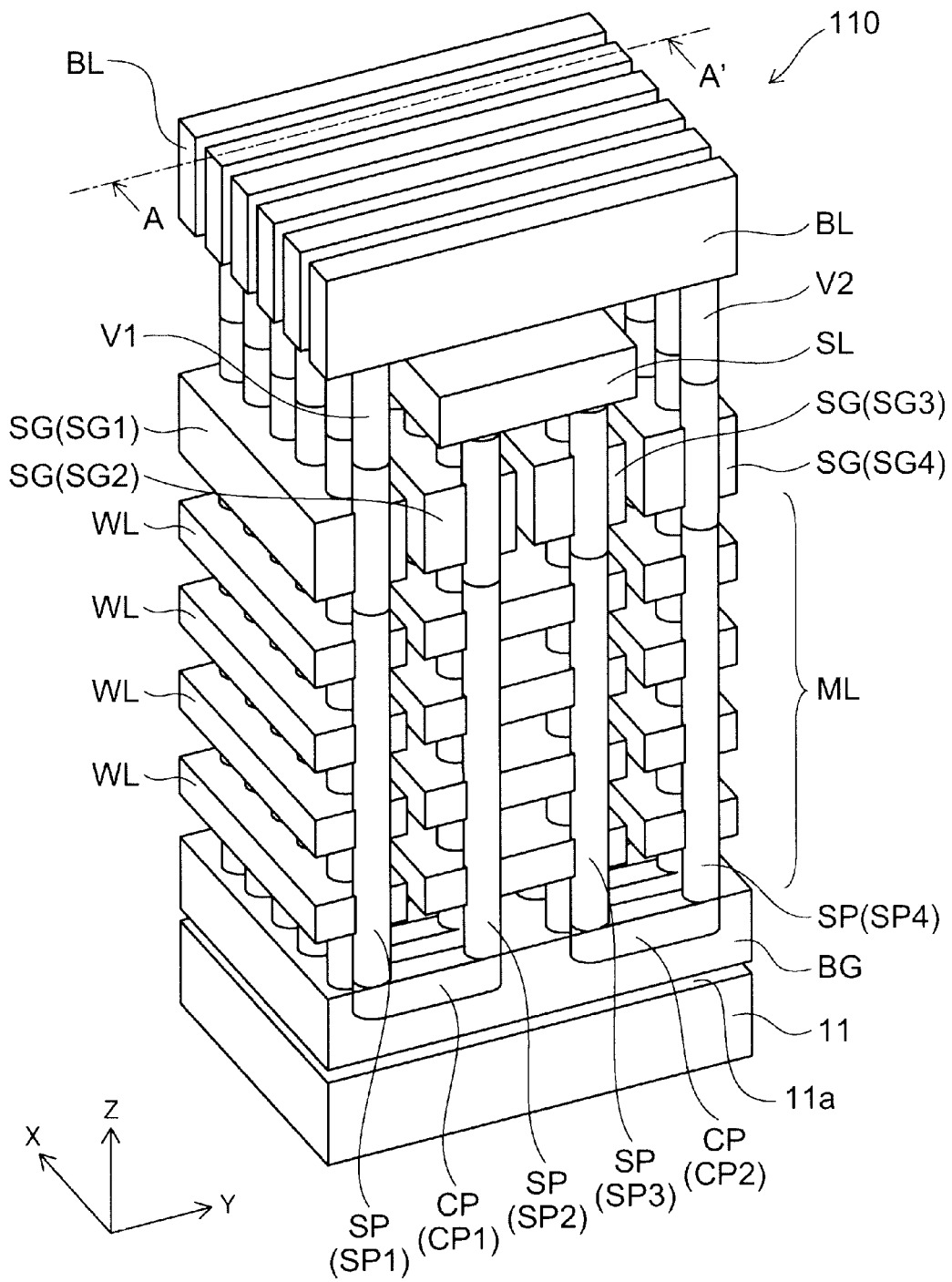
FIG. 2 is a schematic perspective view illustrating the configuration of the nonvolatile semiconductor memory device according to the first embodiment of the invention.

FIG. 2 is a schematic perspective view illustrating the configuration of the nonvolatile semiconductor memory device according to the first embodiment of the invention.

Figure 3:
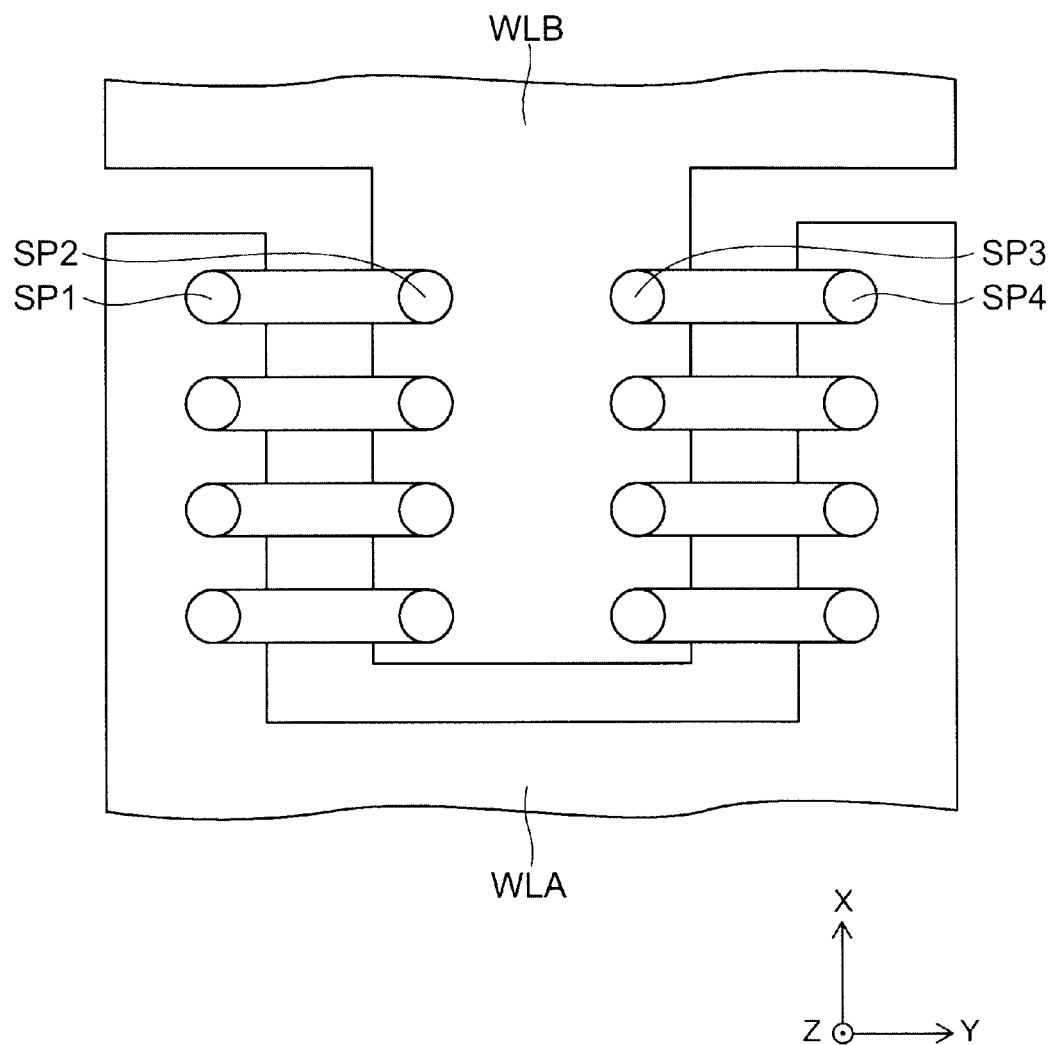
FIG. 3 is a schematic plan view illustrating the configuration of the nonvolatile semiconductor memory device according to the first embodiment of the invention.

FIG. 3 is a schematic plan view illustrating the configuration of the nonvolatile semiconductor memory device according to the first embodiment of the invention.

Here, FIG. 1 illustrates part of the A-A' cross section of FIG. 2. In FIG. 2, for clarity of illustration, only the conductive portions are shown, and illustration of the insulating portions is omitted.

As shown in FIGS. 1, 2, and 3, the nonvolatile semiconductor memory device 110 according to the first embodiment of the invention is a three-dimensional multilayer flash memory. As described later, the nonvolatile semiconductor memory device 110 includes cell transistors arranged in a three-dimensional matrix. Each cell transistor is provided with a charge storage layer and functions as a memory cell for storing data by storing charge in this charge storage layer.

As shown in FIGS. 1 and 2, the nonvolatile semiconductor memory device 110 according to this embodiment includes a semiconductor substrate 11 illustratively made of single crystal silicon. In the semiconductor substrate 11, a memory array region, which memory cells are formed, and a circuit region for driving the memory cells are defined. FIGS. 1 and 2 illustrate the configuration of the memory array region, and an illustration of the circuit region is omitted.

In the memory array region, a multilayer structure ML is formed on the major surface 11a of the semiconductor substrate 11. The multilayer structure ML includes a plurality of constituent multilayer bodies ML1 described later. That is, in the multilayer structure ML, a plurality of constituent multilayer bodies ML1 are stacked in the direction perpendicular to the major surface 11a.

In this specification, for convenience of description, an XYZ orthogonal coordinate system is introduced. In this coordinate system, the direction perpendicular to the major surface 11a of the semiconductor substrate 11 is defined as the Z-axis direction (first direction). Furthermore, one of the directions in a plane parallel to the major surface 11a is defined as the X-axis direction (second direction). The direction perpendicular to the Z-axis and the X-axis is defined as the Y-axis direction (third direction).

The stacking direction of the constituent multilayer bodies ML1 in the multilayer structure ML is the Z-axis direction.

As shown in FIG. 1, each of the constituent multilayer bodies ML1 includes an electrode film WL provided parallel to the major surface 11a, a first insulating film 14, a charge storage layer 23a provided between the electrode film WL and the first insulating film 14, and a second insulating film 24a provided between the charge storage layer 23a and the electrode film WL.

The electrode film WL, the first insulating film 14, the charge storage layer 23a, and the second insulating film 24a are provided parallel to the major surface 11a.

In this example, the charge storage layer 23a and the second insulating film 24a are provided on the upper side (the side opposite to the semiconductor substrate 11) of the electrode film WL. However, alternatively, the charge storage layer 23a and the second insulating film 24a may be provided on the lower side (the semiconductor substrate 11 side) of the electrode film WL.

Furthermore, in this example, one charge storage layer 23a and one second insulating film 24a are provided between the electrode films WL. However, as described later, a plurality of charge storage layers 23a and second insulating films 24a may be provided between the electrode films WL.

In FIG. 2, four electrode films WL are depicted, that is, the multilayer structure ML illustratively includes four constituent multilayer bodies ML1. However, the number of constituent multilayer bodies ML1 stacked in the multilayer structure ML is arbitrary.

The nonvolatile semiconductor memory device 110 includes the semiconductor substrate 11, the aforementioned multilayer structure ML, a semiconductor pillar SP penetrating through the multilayer structure ML in the Z-axis direction, a third insulating film 25 provided between the semiconductor pillar SP and the electrode films WL, and a fourth insulating film 22 provided between the semiconductor pillar SP and the charge storage layer 23a. The semiconductor pillar SP extends in the Z-axis direction.

In this example, the fourth insulating film 22 extends between the first insulating film 14, the second insulating film 24a and the third insulating film 25, on the one hand, and the semiconductor pillar SP, on the other. Thus, the fourth insulating film 22 may extend between the semiconductor pillar SP and at least one of the first insulating film 14, the second insulating film 24a and the third insulating film 25.

The electrode film WL can be made of any conductive material, such as amorphous silicon or polysilicon endowed with conductivity by impurity doping, or a metal or an alloy. A prescribed potential is applied to the electrode film WL by a driver circuit (not shown) formed in the circuit region, and thus the electrode film WL functions as a word line of the nonvolatile semiconductor memory device 110.

On the other hand, the first insulating film 14, the second insulating film 24a, the third insulating film 25, and the fourth insulating film 22 are illustratively made of silicon oxide.

The first insulating film 14 functions as an interlayer insulating film for insulation between the electrode films WL. A memory cell is formed near the portion where the semiconductor pillar SP is opposed to each of the electrode films WL. The fourth insulating film 22 functions as a tunnel insulating film, and the second insulating film 24a functions as a block insulating film. The thickness (length along the first direction) of each second insulating film 24a is thinner (shorter) than the thickness (length along the first direction) of each first insulating film 14. The thickness (length along the direction orthogonal to the first direction) of each fourth insulating film 22 is thinner (shorter) than the thickness (length along the first direction) of each first insulating film 14. The thickness (length along the direction orthogonal to the first direction) of each third insulating film 25 is thinner (shorter) than the thickness (length along the first direction) of each first insulating film 14.

The charge storage layer 23a can illustratively be a silicon nitride film, and functions as a memory layer by storing or releasing charge under an electric field applied between the semiconductor pillar SP and the electrode films WL. The charge storage layer 23a can be a monolayer film or a multilayer film.

As shown in FIG. 2, select gate electrodes SG are provided above the multilayer structure ML. The select gate electrode SG can be made of any conductive material, such as polysilicon. The select gate electrodes SG are formed from a conductive film divided along a certain direction. In this example, the select gate electrode SG is divided along the Y-axis direction. That is, the select gate electrodes SG are a plurality of wiring-shaped conductive members extending in the X-axis direction.

On the other hand, the electrode film WL is a conductive film parallel to the XY plane, and illustratively divided in units of erasure blocks. Alternatively, the electrode film WL may also be divided so as to extend, for instance, in the X-axis direction like the select gate electrode SG.

Furthermore, a plurality of through holes TH extending in the stacking direction (Z-axis direction) are formed in the multilayer structure ML and the select gate electrode SG. The fourth insulating film 22 is provided on the inner side surface of the through hole TH, and a semiconductor material is buried in the space inside it to constitute a semiconductor pillar SP.

In this example, the nonvolatile semiconductor memory device 110 further includes a first connecting portion CP1, which electrically connects between a first semiconductor pillar SP1 and a second semiconductor pillar SP2 on the semiconductor substrate 11 side. In other words, the first and second semiconductor pillars SP1 and SP2 are connected by the first connecting portion CP1 and function as one U-shaped NAND string.

However, this invention is not limited thereto. Each semiconductor pillar SP may be independent and may not be connected by the connecting portion CP on the semiconductor substrate 11 side. In this case, select gate electrodes for selecting each semiconductor pillar SP are provided above and below the multilayer structure ML, respectively. In the following, a description is given of the case where two semiconductor pillars SP are connected by the first connecting portion CP1.

Here, the nonvolatile semiconductor memory device 110 includes a plurality of semiconductor pillars. When all or any of the semiconductor pillars are referred to, the wording "semiconductor pillar SP" is used. On the other hand, when a particular semiconductor pillar is referred to in describing the relationship between particular semiconductor pillars, for instance, the wording "n-th semiconductor pillar SPn" (n is any integer of one or more) is used. The same also applies to other components. For instance, when all or any of the connecting portions are referred to, the wording "connecting portion CP" is used. On the other hand, when a particular connecting portion is referred to, the wording "n-th connecting portion CPn" (n is any integer of one or more) is used.

As shown in FIG. 2, the first and second semiconductor pillars SP1 and SP2 connected by the first connecting portion CP1 are paired into one U-shaped NAND string, and the third and fourth semiconductor pillars SP3 and SP4 connected by the second connecting portion CP2 are paired into another U-shaped NAND string.

Furthermore, as shown in FIG. 3, among the electrode films WL, the electrode films corresponding to the semiconductor pillars SP(4m+1) and SP(4m+4) with the aforementioned integer n being equal to (4m+1) and (4m+4) are commonly connected into an electrode film WLA, and the electrode films corresponding to the semiconductor pillars SP(4m+2) and SP(4m+3) with n being equal to (4m+2) and (4m+3) are commonly connected into an electrode film WLB, where m is an integer of zero or more. That is, the electrode films WL are shaped into the electrode film WLA and the electrode film WLB, which are opposed in the X-axis direction and meshed with each other like comb teeth. In other words, the electrode film WLA and the electrode film WLB have a structure of inter digital electrodes, or multi-finger electrodes.

Although not shown in FIG. 3, at both ends in the X-axis direction, the electrode film WLA and the electrode film WLB are electrically connected to a peripheral circuit provided, for instance, in the semiconductor substrate 11. That is, for instance, like the "staircase structure" described in JP-A 2007-266143 (Kokai), the X-axis length of each of the electrode films WL (electrode films WLA and electrode films WLB) stacked in the Z-axis direction are varied in a staircase pattern so that electrical connection to the peripheral circuit is achieved by the electrode film WLA on one end in the X-axis direction and by the electrode film WLB on the other end in the X-axis direction.

Thus, in the electrode films WL equidistant from the semiconductor substrate 11, the first semiconductor pillar SP1 and the second semiconductor pillar SP2 constituting a pair can be placed at different potentials. Furthermore, in the electrode films WL equidistant from the semiconductor substrate 11, the third semiconductor pillar SP3 and the fourth semiconductor pillar SP4 can be placed at different potentials. Thus, the memory cells in the same layer corresponding to the first semiconductor pillar SP1 and the second semiconductor pillar SP2 can be operated independently of each other, and the memory cells in the same layer corresponding to the third semiconductor pillar SP3 and the fourth semiconductor pillar SP4 can be operated independently of each other.

The combination of the electrode film WLA and the electrode film WLB can constitute one erasure block, and a set of the electrode film WLA and the electrode film WLB is divided from another set of the electrode film WLA and the electrode film WLB in units of erasure blocks.

In addition, the number of semiconductor pillars in the X-axis and Y-axis directions contained in each erasure block is arbitrary.

Here, as illustrated in FIG. 1, the third insulating film 25 is provided between the semiconductor pillar SP and the electrode film WL, and the fourth insulating film 22 is provided between the semiconductor pillar SP and the charge storage layer 23a. However, the fourth insulating film 22 may extend between the third insulating film 25 and the semiconductor pillar SP. Furthermore, the fourth insulating film 22 may extend between the first insulating film 14 and the semiconductor pillar SP. Furthermore, the fourth insulating film 22 may extend between the second insulating film 24a and the semiconductor pillar SP. In other words, the fourth insulating film 22 may be continuously provided inside the through hole TH.

In the foregoing, the insulating film provided between the semiconductor pillar SP and the electrode films WL is referred to as the third insulating film 25, and the insulating film provided between the semiconductor pillar SP and the charge storage layer 23a is referred to as the fourth insulating film 22. However, the third insulating film 25 and the fourth insulating film 22 may be integrally provided without distinction.

As described later, the third insulating film 25 can be formed by oxidizing the electrode film WL exposed to the inner surface of the through hole TH. Subsequently, the fourth insulating film 22 can be formed on the inner sidewall of the through hole TH.

In the nonvolatile semiconductor memory device 110, the fourth insulating film 22 (tunnel insulating film) and the semiconductor pillar SP are provided inside the through hole TH. On the other hand, the charge storage layer 23a and the second insulating film 24a (block insulating film) are stacked together with the electrode film WL and not provided inside the through hole TH. Thus, the diameter of the through hole TH can be reduced to provide a nonvolatile semiconductor memory device enabling higher density packaging.

In addition, a dividing insulating layer IL is provided between two semiconductor pillars SP neighboring in the Y-axis direction to divide the electrode film WL, the first insulating film 14, the charge storage layer 23a, and the second insulating film 24a.

Comparative Examples

FIGS. 4A and 4B are schematic cross-sectional views illustrating the configuration of a nonvolatile semiconductor memory device of comparative examples.

Figure 5:
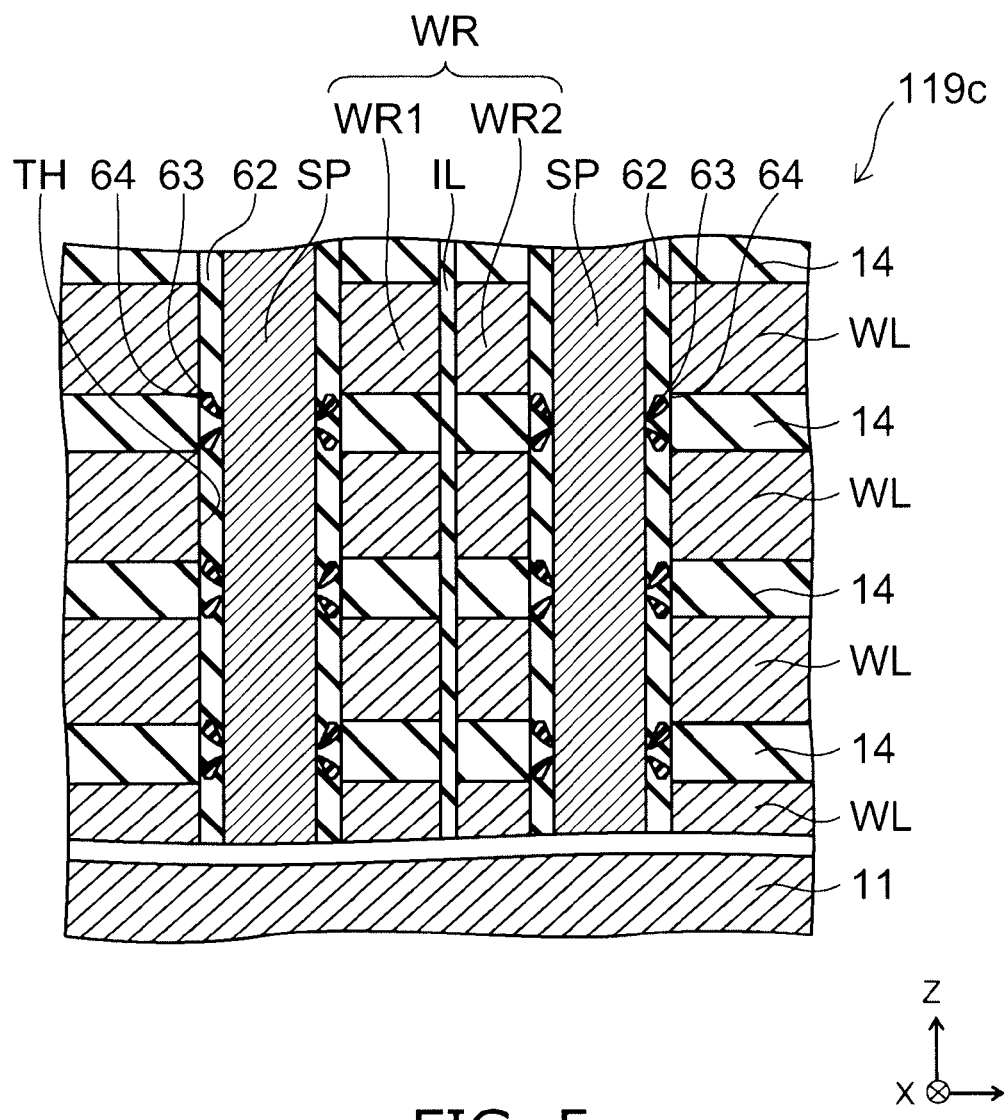
FIG. 5 is a schematic cross-sectional view illustrating the configuration of a nonvolatile semiconductor memory device of another comparative example.

FIG. 5 is a schematic cross-sectional view illustrating the configuration of a nonvolatile semiconductor memory device of another comparative example.

That is, FIGS. 4A, 4B, and 5 illustrate the structure of nonvolatile semiconductor memory devices 119a, 119b, and 119c of a first, second, and third comparative examples.

As shown in FIG. 4A, in the nonvolatile semiconductor memory device 119a of the first comparative example, a block insulating film 64, a charge storage layer 63, and a tunnel insulating film 62 are provided inside a through hole TH, and a semiconductor pillar SP is provided inside them.

Thus, it is difficult to reduce the diameter of the through hole TH. Furthermore, there are restrictions on the thickness of these films and the semiconductor pillar SP.

As shown in FIG. 4B, in the nonvolatile semiconductor memory device 119b of the second comparative example, the charge storage layer 63 is divided. More specifically, the charge storage layer 63 is localized between the semiconductor pillar SP and the electrode film WL. Also in this case, because the block insulating film 64, the charge storage layer 63, and the tunnel insulating film 62 are provided inside the through hole TH, it is difficult to reduce the diameter of the through hole TH. Furthermore, there are restrictions on the thickness of these films and the semiconductor pillar SP. Moreover, many restrictions are also imposed on the manufacturing process, and hence the device is difficult to manufacture.

As shown in FIG. 5, in the nonvolatile semiconductor memory device 119c of the third comparative example, a charge storage layer 63 is provided in a portion of the first insulating film 14 opposed to the semiconductor pillar SP between the electrode films WL. The insulating film between the charge storage layer 63 and the electrode film WL serves as a block insulating film 64, and the insulating film between the charge storage layer 63 and the semiconductor pillar SP serves as a tunnel insulating film 62. In the nonvolatile semiconductor memory device 119c, the block insulating film 64, the charge storage layer 63, and the tunnel insulating film 62 are not stacked, but the charge storage layer 63 is localized between the electrode films WL. Hence, the diameter of the through hole TH can be made smaller than in the nonvolatile semiconductor memory devices 119a and 119b. However, the structure of the nonvolatile semiconductor memory device 119c is complicated and difficult to manufacture.

In contrast, as described above, in the nonvolatile semiconductor memory device 110 according to this embodiment, because only the fourth insulating film 22 and the semiconductor pillar SP are provided inside the through hole TH, the diameter of the through hole TH can be reduced to enable higher density packaging. Furthermore, high productivity is achieved because the structure is not complicated.

In addition, besides between the charge storage layer 23a and the semiconductor pillar SP, the fourth insulating film 22 may be provided so as to continuously extend between the first insulating film 14, the second insulating film 24a and the third insulating film 25, and the semiconductor pillar SP. Alternatively, the fourth insulating film 22 may be divided by the third insulating film 25, for instance, and provided discontinuously.

Figure 6:
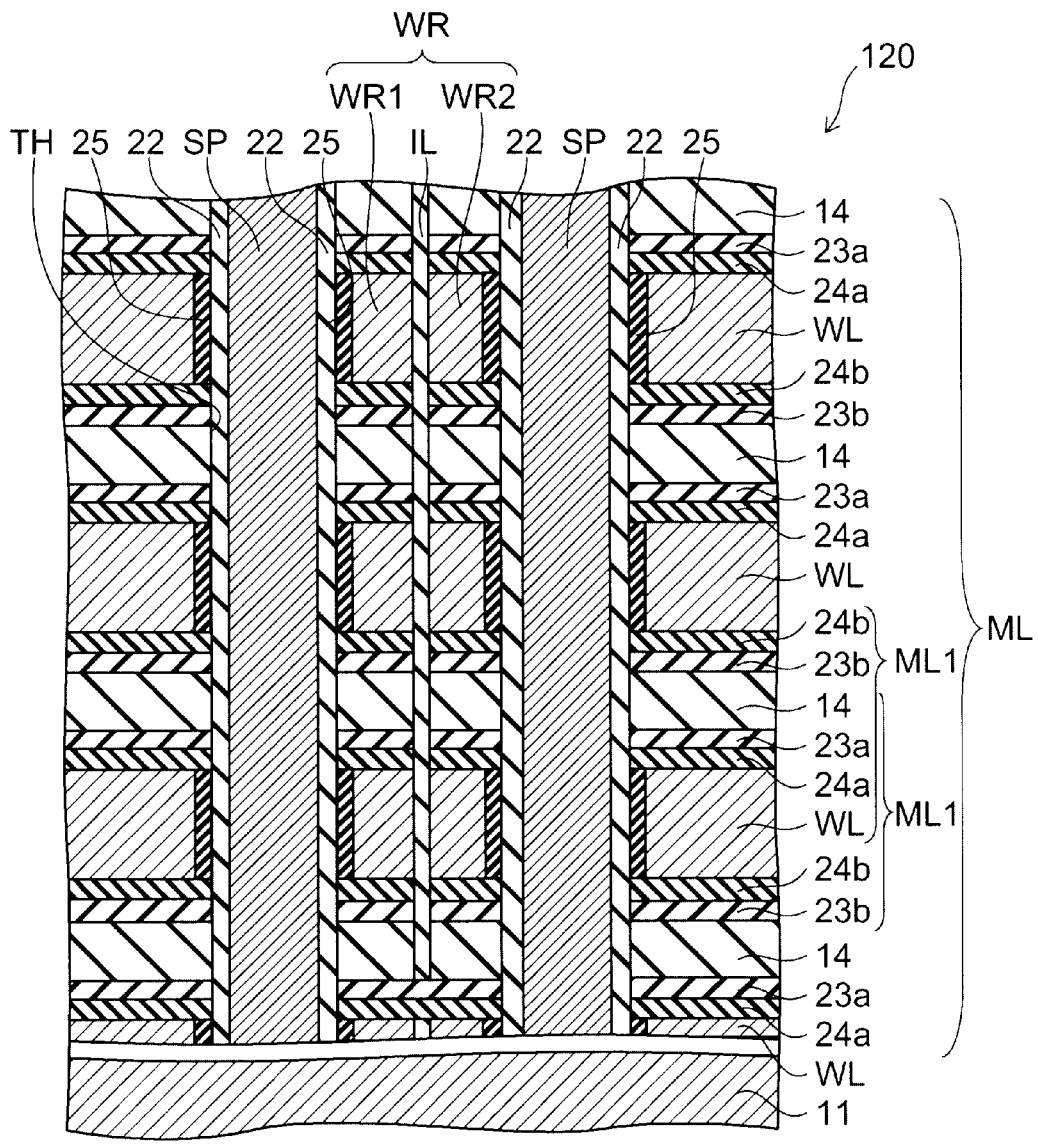
FIG. 6 is a schematic cross-sectional view illustrating the configuration of an alternative nonvolatile semiconductor memory device according to the first embodiment of the invention.

FIG. 6 is a schematic cross-sectional view illustrating the configuration of another nonvolatile semiconductor memory device according to the first embodiment of the invention.

As shown in FIG. 6, in another nonvolatile semiconductor memory device 120 according to this embodiment, a plurality of charge storage layers and block insulating films are provided between the electrode films WL.

More specifically, in each constituent multilayer body ML1 of the multilayer structure ML of the nonvolatile semiconductor memory device 120, the charge storage layers are provided both above and below the electrode film WL, and the second insulating film is provided between the electrode film WL and each of the charge storage layers provided above and below the electrode film WL.

In other words, each of the plurality of constituent multilayer bodies ML1 includes an electrode film WL provided parallel to the major surface 11a, a first insulating film 14, an upper charge storage layer 23a provided between the electrode film WL and the first insulating film 14, an upper second insulating film 24a provided between the charge storage layer 23a and the electrode film WL, a lower charge storage layer 23b provided on the opposite side of the electrode film WL from the first insulating film 14, and a lower second insulating film 24b provided between the charge storage layer 23b and the electrode film WL.

Thus, the constituent multilayer body ML1 can illustratively be a multilayer body of the charge storage layer 23b, the second insulating film 24b, the electrode film WL, the second insulating film 24a, the charge storage layer 23a, and the first insulating film 14, which are sequentially arranged from the semiconductor substrate 11 side. Alternatively, the constituent multilayer body ML1 can be a multilayer body of the electrode film WL, the second insulating film 24a, the charge storage layer 23a, the first insulating film 14, the charge storage layer 23b, and the second insulating film 24b, which are sequentially arranged from the semiconductor substrate 11 side, and how the constituent multilayer bodies ML1 are segmented in the multilayer structure is arbitrary. However, because the charge storage layers 23a and 23b placed above and below one electrode film WL operate as one memory cell, it is convenient to regard the constituent multilayer body ML1 as a multilayer body of the charge storage layer 23b, the second insulating film 24b, the electrode film WL, the second insulating film 24a, the charge storage layer 23a, and the first insulating film 14, which are sequentially arranged from the semiconductor substrate 11 side. However, even in this case, the insulating film 14 can be regarded as being placed below the electrode film WL, or above the electrode film WL.

Also in the nonvolatile semiconductor memory device 120, because only the fourth insulating film 22 and the semiconductor pillar SP are provided inside the through hole TH, the diameter of the through hole TH can be reduced, higher density packaging can be achieved, and the productivity can be improved.

Furthermore, in the nonvolatile semiconductor memory device 120, because the charge storage layers 23a and 23b are provided above and below one electrode film WL, two memory portions are formed in one memory cell. Thus, two bits of information can also be stored in one memory cell.

The charge storage layer 23b can illustratively be a silicon nitride film, like the charge storage layer 23a. The charge storage layer 23b can be made of the same material as the charge storage layer 23a. Alternatively, the charge storage layer 23b can be made of a material and layer configuration different from the charge storage layer 23a. Furthermore, the charge storage layer 23b can be monolayer, or can be a multilayer film.

In the nonvolatile semiconductor memory device 120, one charge storage layer 23a and one charge storage layer 23b are provided respectively on the upper and lower side of one electrode film WL. However, on at least one of the upper and lower sides, a plurality of charge storage layers can be provided.

Figure 7A:
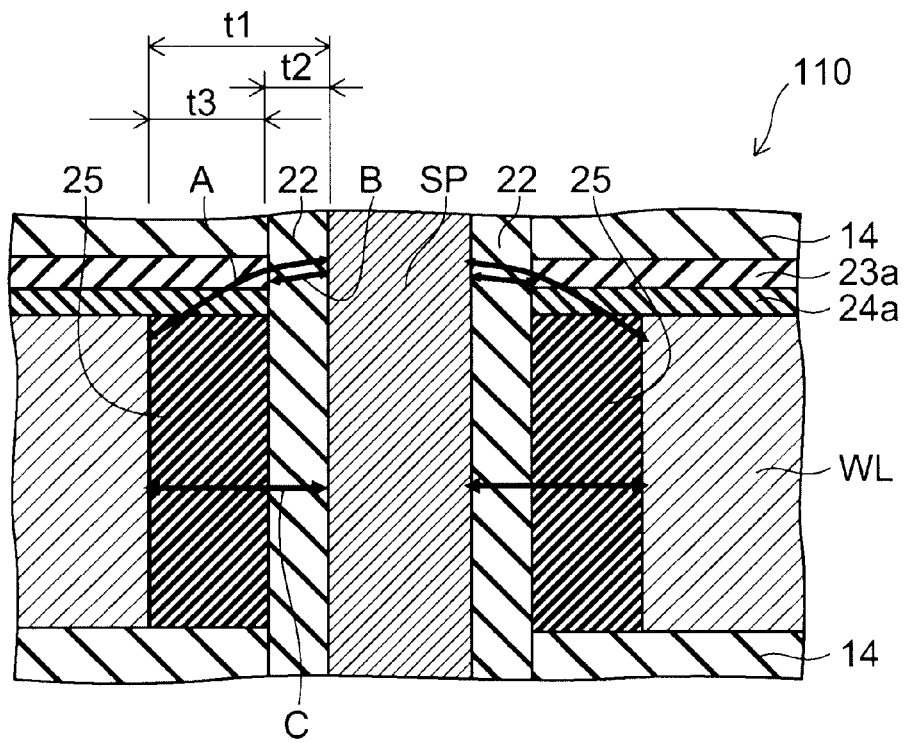
FIGS. 7A and 7B are schematic cross-sectional views illustrating the operation of the nonvolatile semiconductor memory device according to the first embodiment of the invention.
Figure 7B:
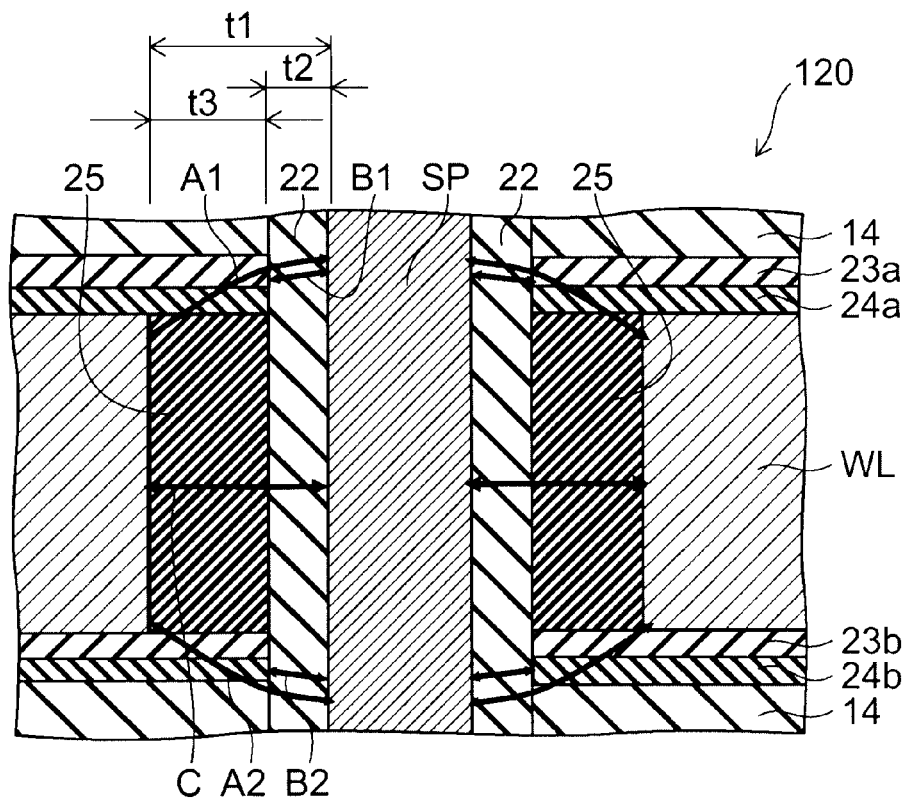

FIGS. 7A and 7B are schematic cross-sectional views illustrating the operation of the nonvolatile semiconductor memory device according to the first embodiment of the invention.

More specifically, FIGS. 7A and 7B illustrate the operations of the nonvolatile semiconductor memory devices 110 and 120, respectively.

As shown in FIG. 7A, in the nonvolatile semiconductor memory device 110, charge is written into the charge storage layer 23a above the electrode film WL through the fourth insulating film 22. More specifically, charge is written into the charge storage layer 23a by an electric field of the path A.

That is, charge is written from the semiconductor pillar SP through the fourth insulating film 22 into the charge storage layer 23a along the path B.

Furthermore, as shown in FIG. 7B, in the nonvolatile semiconductor memory device 120, charge is written into the charge storage layers 23a and 23b above and below the electrode film WL through the fourth insulating film 22. More specifically, charge is written into the charge storage layers 23a and 23b by an electric field of the paths A1 and A2. That is, charge is written from the semiconductor pillar SP through the fourth insulating film 22 into the charge storage layers 23a and 23b along the paths B1 and B2.

Here, it is preferable to prevent charge from directly migrating between the semiconductor pillar SP and the electrode film WL like the path C.

In order to do this, the distance t1 between the semiconductor pillar SP and the electrode film WL in the direction parallel to the major surface 11a is preferably longer than the distance t2 between the semiconductor pillar SP and the charge storage layer 23a.

In this example, the fourth insulating film 22 extends between the third insulating film 25 and the semiconductor pillar SP. Hence, by the amount of the thickness t3 of the third insulating film 25, the thickness (distance t1) of the insulating film between the semiconductor pillar SP and the electrode film WL is larger than the distance t2 between the semiconductor pillar SP and the charge storage layer 23a. Hence, if the fourth insulating film 22 extends between the third insulating film 25 and the semiconductor pillar SP, the thickness t3 of the third insulating film 25 is arbitrary.

In other words, the electric field applied between the semiconductor pillar SP and the electrode film WL (such as the electric field of the path C) is preferably lower than the electric field applied between the semiconductor pillar SP and the charge storage layer 23a (such as the electric field of the paths B, B1, and B2). The electric field applied to the third insulating film 25 and the fourth insulating film 22 is preferably lower (smaller) than the electric field applied to the tunnel insulating film, the charge storage layer, and the block insulating film. This enables stable operation.

Practical Example

In the following, as a practical example according to this embodiment, a nonvolatile semiconductor memory device 121 having the structure of the nonvolatile semiconductor memory device 120 is described.

Figure 8:
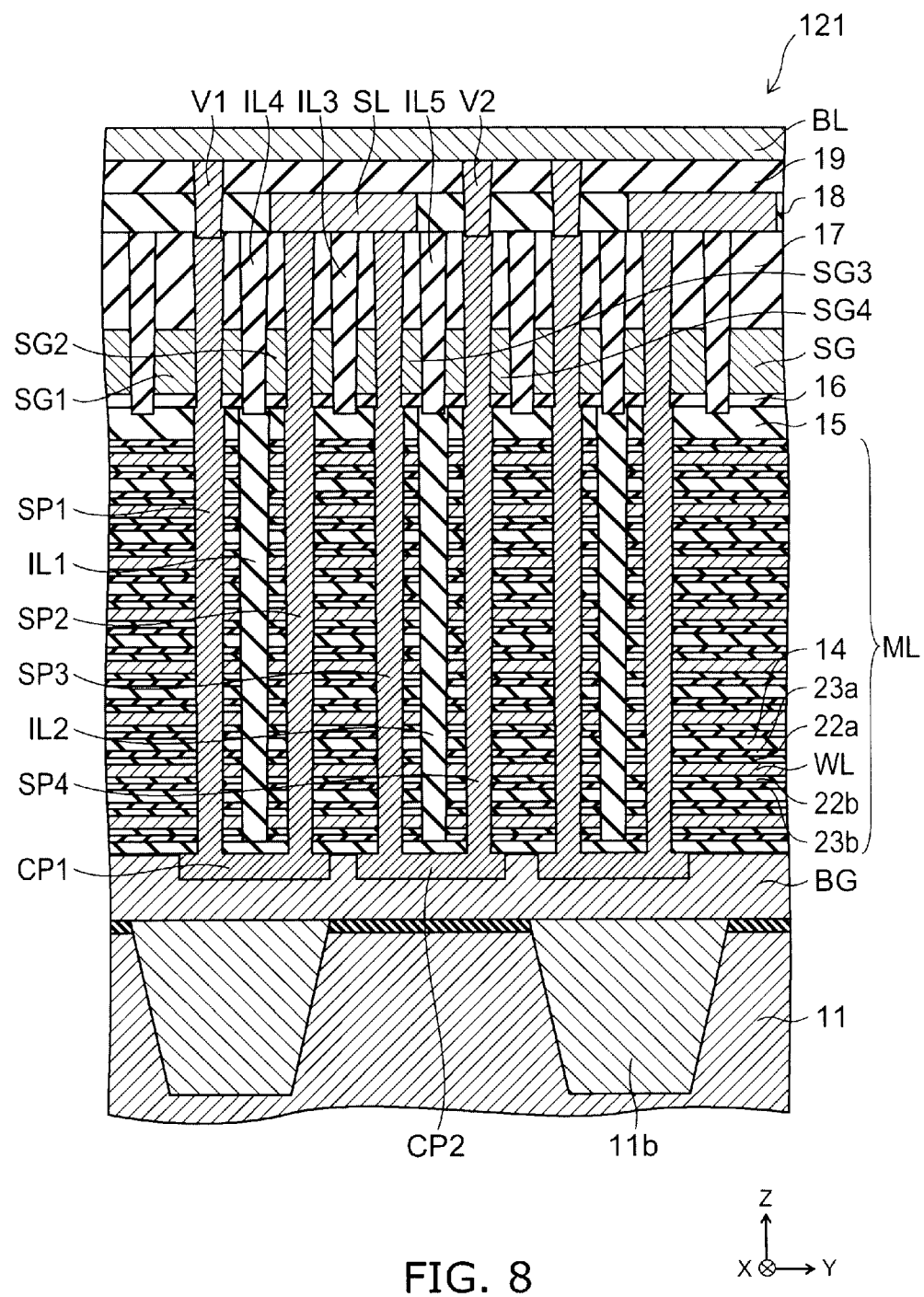
FIG. 8 is a schematic cross-sectional view illustrating the configuration of a nonvolatile semiconductor memory device according to a practical example of the invention.

FIG. 8 is a schematic cross-sectional view illustrating the configuration of a nonvolatile semiconductor memory device according to the practical example of the invention.

Figure 9:
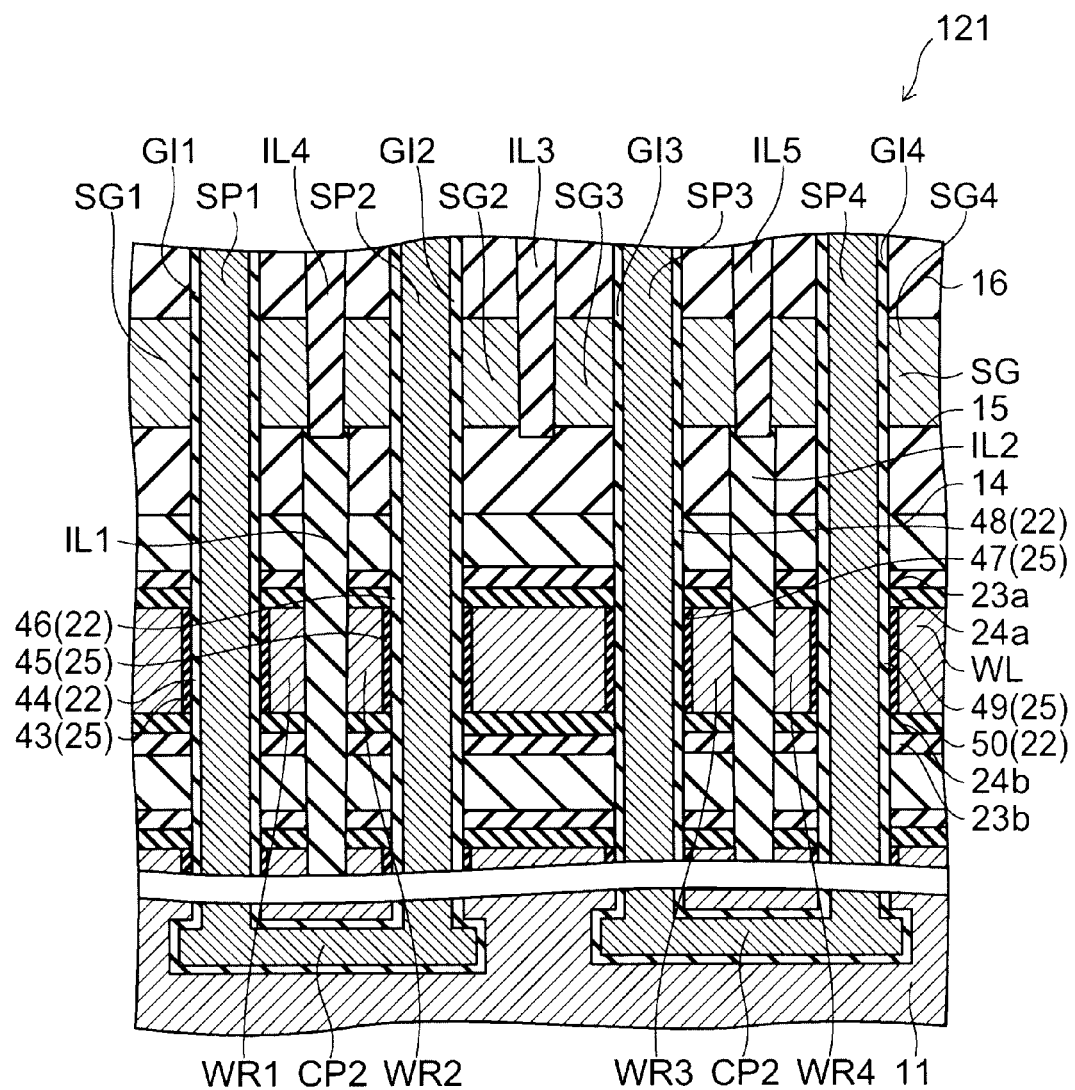
FIG. 9 is a schematic cross-sectional view illustrating the configuration of a relevant part of the nonvolatile semiconductor memory device according to the practical example of the invention.

FIG. 9 is a schematic cross-sectional view illustrating the configuration of a relevant part of the nonvolatile semiconductor memory device according to the practical example of the invention.

As shown in FIG. 8, in the nonvolatile semiconductor memory device 121 according to this practical example, the semiconductor substrate 11 includes a device isolation 11b, and a back gate portion BG is provided thereon. Furthermore, a multilayer structure ML described earlier is provided on the back gate portion BG.

In the multilayer structure ML, semiconductor pillars SP described earlier are provided in a matrix in the X-axis and Y-axis directions. Furthermore, two semiconductor pillars SP neighboring in the Y-axis direction are electrically connected in the back gate portion BG.

More specifically, as shown in FIG. 9, the nonvolatile semiconductor memory device 121 includes a semiconductor substrate 11, a multilayer structure ML, a first semiconductor pillar SP1 (semiconductor pillar SP), a third insulating film 43 (third insulating film 25), and a fourth insulating film 44 (fourth insulating film 22), which are described earlier. Furthermore, the nonvolatile semiconductor memory device 121 includes a second semiconductor pillar SP2 (semiconductor pillar SP) neighboring the first semiconductor pillar SP1 in the Y-axis direction and penetrating through the multilayer structure ML in the Z-axis direction, a fifth insulating film 45 provided between the second semiconductor pillar SP2 and the electrode film WL, and a sixth insulating film 46 provided between the second semiconductor pillar SP2 and the charge storage layers 23a and 23b.

The fifth insulating film 45 and the sixth insulating film 46 associated with the semiconductor pillar SP2 can have the same structure as the third insulating film 25 and the fourth insulating film 22 described earlier.

The nonvolatile semiconductor memory device 121 further includes a first connecting portion CP1, which electrically connects between the first semiconductor pillar SP1 and the second semiconductor pillar SP2 on the semiconductor substrate 11 side. That is, the first and second semiconductor pillars SP1 and SP2 are connected by the first connecting portion CP1 and function as one U-shaped NAND string.

The first connecting portion CP1 can be made of substantially the same material as the first and second semiconductor pillars SP1 and SP2.

Furthermore, as shown in FIG. 8, one end of a particular NAND string is connected to a bit line BL, and the other end is connected to a source line SL.

More specifically, the nonvolatile semiconductor memory device 121 further includes a bit line BL extending in the Y-axis direction and connected to a first end portion of the first semiconductor pillar SP1 located on the opposite side from the semiconductor substrate, and a source line extending in the X-axis direction and connected to a second end portion of the second semiconductor pillar SP2 located on the opposite side from the semiconductor substrate 11.

Here, an interlayer insulating film 19 is provided between the source line SL and the bit line BL.

Furthermore, on the first and second semiconductor pillars SP1 and SP2 select gate electrodes SG are provided between the portion of the multilayer structure ML serving as a NAND string, and the bit line BL and the source line SL.

More specifically, as shown in FIG. 9, on the side of the multilayer structure ML opposite to the semiconductor substrate 11, the nonvolatile semiconductor memory device 121 further includes a first select gate electrode SG1 and a second select gate electrode SG2 extending in the X-axis direction and respectively penetrated by the first semiconductor pillar SP1 and the second semiconductor pillar SP2, a first gate insulating film GI1 provided between the first semiconductor pillar SP1 and the first select gate electrode SG1, and a second gate insulating film GI2 provided between the second semiconductor pillar SP2 and the second select gate electrode SG2.

Furthermore, the electrode film WL is divided between the first and second semiconductor pillars SP1 and SP2 constituting a U-shaped NAND string.

More specifically, the nonvolatile semiconductor memory device 121 further includes a first dividing insulating layer IL1 provided between the first semiconductor pillar SP1 and the second semiconductor pillar SP2 and dividing the electrode film WL into a first region WR1 opposed to the first semiconductor pillar SP1 and a second region WR2 opposed to the second semiconductor pillar SP2. Here, the first dividing insulating layer IL1 also divides the first insulating film 14, the second insulating films 24a and 24b, and the charge storage layers 23a and 23b, besides the electrode film WL.

This structure enables the select gate electrodes SG to select a NAND string, and the nonvolatile semiconductor memory device 121 can store and read desired data in a given NAND string.

Furthermore, as shown in FIG. 8, in the nonvolatile semiconductor memory device 121, two NAND strings neighboring in the Y-axis direction are connected to one source line SL and one bit line BL.

More specifically, the nonvolatile semiconductor memory device 121 further includes a third semiconductor pillar SP3 neighboring the second semiconductor pillar SP2 in the Y-axis direction on the opposite side of the second semiconductor pillar SP2 from the first semiconductor pillar SP1 and penetrating through the multilayer structure ML in the Z-axis direction, and a fourth semiconductor pillar SP4 neighboring the third semiconductor pillar SP3 in the Y-axis direction on the opposite side of the third semiconductor pillar SP3 from the second semiconductor pillar SP2 and penetrating through the multilayer structure ML in the Z-axis direction.

Furthermore, a seventh insulating film 47 is provided between the third semiconductor pillar SP3 and the electrode film WL, an eighth insulating film 48 is provided between the third semiconductor pillar SP3 and the charge storage layers 23a and 23b, a ninth insulating film 49 is provided between the fourth semiconductor pillar SP4 and the electrode film WL, and a tenth insulating film 50 is provided between the fourth semiconductor pillar SP4 and the charge storage layers 23a and 23b.

The seventh and ninth insulating films 47 and 49 can have the same structure as the third insulating film 25 described earlier. The eighth and tenth insulating films 48 and 50 can have the same structure as the fourth insulating film 22 described earlier.

Furthermore, a second connecting portion CP2, which electrically connects between the third semiconductor pillar SP3 and the fourth semiconductor pillar SP4 on the semiconductor substrate 11 side, is further provided. That is, the third and fourth semiconductor pillars SP3 and SP4 are connected by the second connecting portion CP2 and function as one U-shaped NAND string. The second connecting portion CP2 can also be made of substantially the same material as the third and fourth semiconductor pillars SP3 and SP4.

Furthermore, a second dividing insulating layer IL2 dividing the electrode film WL into a third region WR3 opposed to the third semiconductor pillar SP3 and a fourth region WR4 opposed to the fourth semiconductor pillar SP4 is further provided between the third semiconductor pillar SP3 and the fourth semiconductor pillar SP4.

Furthermore, on the side of the multilayer structure ML opposite to the semiconductor substrate 11, a third select gate electrode SG3 and a fourth select gate electrode SG4 extending in the X-axis direction and respectively penetrated by the third semiconductor pillar SP3 and the fourth semiconductor pillar SP4, a third gate insulating film GI3 provided between the third semiconductor pillar SP3 and the third select gate electrode SG3, and a fourth gate insulating film GI4 provided between the fourth semiconductor pillar SP4 and the fourth select gate electrode SG4, are further provided.

The bit line BL is connected to a fourth end portion of the fourth semiconductor pillar SP4 located on the opposite side from the semiconductor substrate 11, and the source line SL is connected to a third end portion of the third semiconductor pillar SP3 located on the opposite side from the semiconductor substrate 11.

Thus, in the nonvolatile semiconductor memory device 121, two NAND strings neighboring in the Y-axis direction share the source line SL and the bit line BL.

In addition, a third dividing insulating layer IL3 is provided between the second select gate electrode SG2 and the third select gate electrode SG3 so that the second select gate electrode SG2 and the third select gate electrode SG3 are insulated from each other.

Furthermore, a fourth dividing insulating layer IL4 is provided at a position between the first and second semiconductor pillars SP1 and SP2 to divide between the first and second select gate electrodes SG1 and SG2. The fourth dividing insulating layer IL4 is provided illustratively above the first dividing insulating layer IL1.

Furthermore, a fifth dividing insulating layer IL5 is provided at a position between the third and fourth semiconductor pillars SP3 and SP4 to divide between the third and fourth select gate electrodes SG3 and SG4. The fifth dividing insulating layer IL5 is provided illustratively above the second dividing insulating layer IL2.

In the following, an example method for manufacturing the nonvolatile semiconductor memory device 121 is described.

FIGS. 10A to 20B are sequential schematic cross-sectional views illustrating the method for manufacturing a nonvolatile semiconductor memory device according to the practical example of the invention.

These figures correspond to the A-A' cross section of FIG. 2.

Figure 10A:
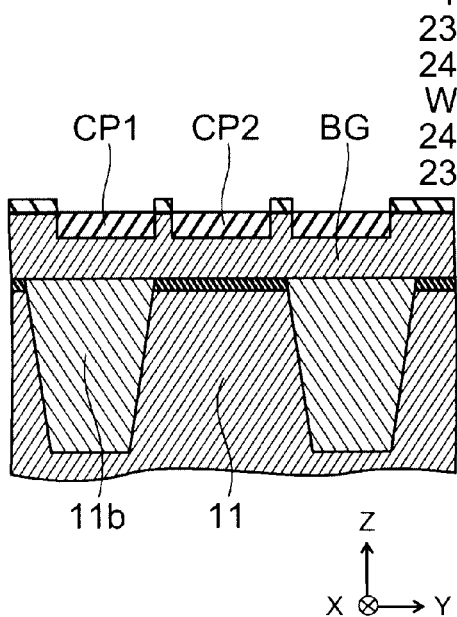
FIGS. 10A and 10B are sequential schematic cross-sectional views illustrating a method for manufacturing a nonvolatile semiconductor memory device according to the practical example of the invention.

First, as shown in FIG. 10A, a device isolation 11b is formed in a semiconductor substrate 11, and a back gate portion BG is formed thereon. Next, portions to serve as a first and second connecting portions CP1 and CP2 are formed illustratively from silicon nitride film.

Figure 10B:
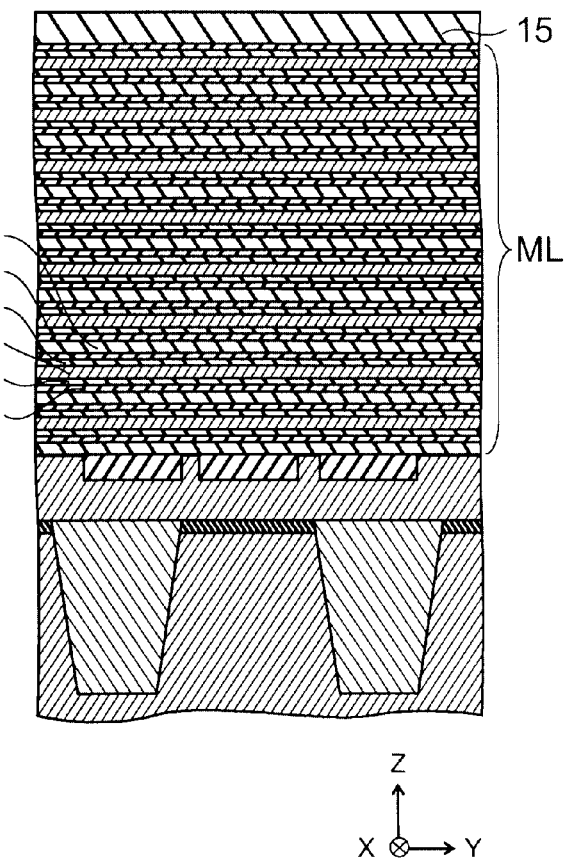

Next, as shown in FIG. 10B, a first insulating film 14, a charge storage layer 23b, a second insulating film 24b, an electrode film WL, a second insulating film 24a, and a charge storage layer 23a are repeatedly formed thereon to form a multilayer structure ML. Next, an interlayer insulating film 15 is further formed thereon.

Figure 11A:
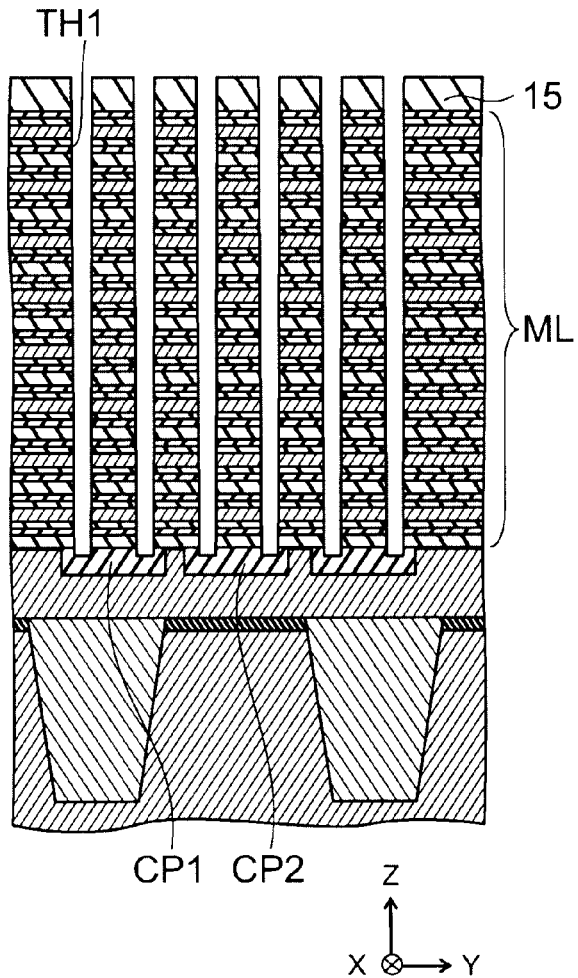
FIGS. 11A and 11B are schematic views showing processes following FIG. 10B.

Next, as shown in FIG. 11A, through holes TH are formed in the multilayer structure ML and the interlayer insulating film 15. Here, the through holes TH are formed down to the first and second connecting portions CP1 and CP2. In other words, the through holes TH are formed halfway through the thickness of the semiconductor substrate 11 and reach the first and second connecting portions CP1 and CP2.

Figure 11B:
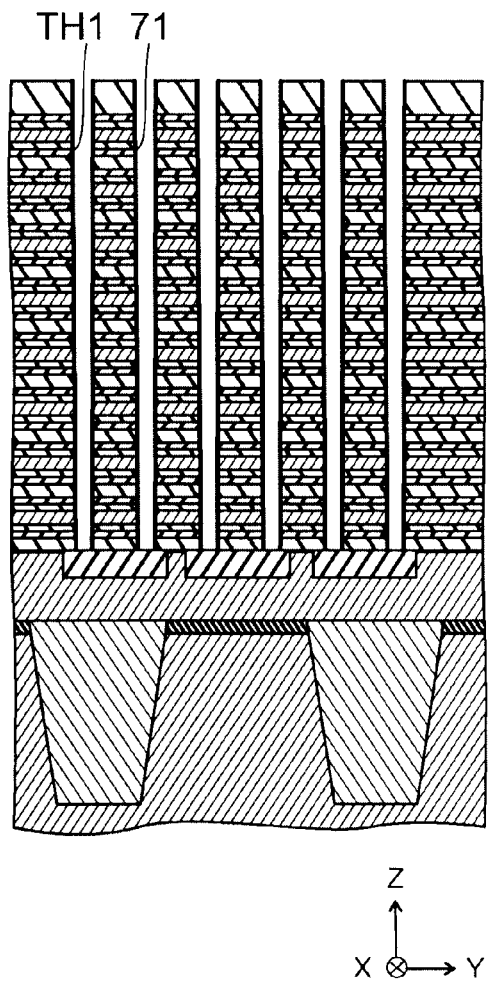

Next, as shown in FIG. 11B, a silicon oxide film 71 is formed on the inner wall of the through hole TH, and the silicon oxide film 71 at the bottom of the through hole TH is removed illustratively by dry etching.

Figure 12A:
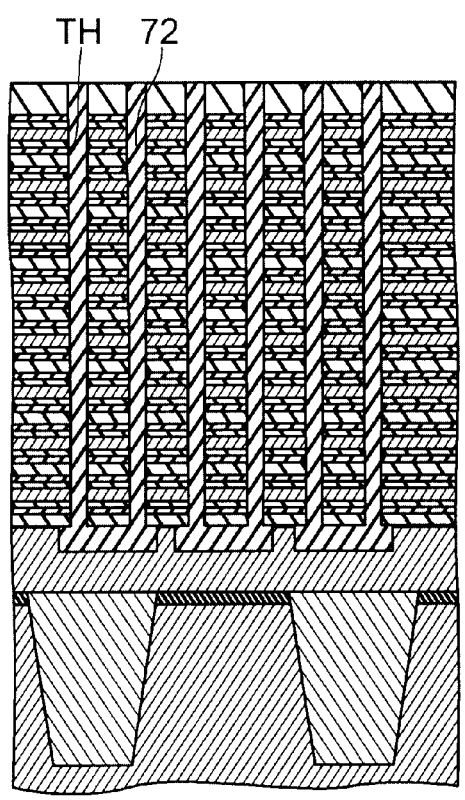
FIGS. 12A and 12B are schematic views showing processes following FIG. 11B.

Next, as shown in FIG. 12A, a silicon nitride film, for instance, is buried as a sacrificial film 72 inside the through hole TH, and the surface is planarized illustratively by CMP.

Figure 12B:
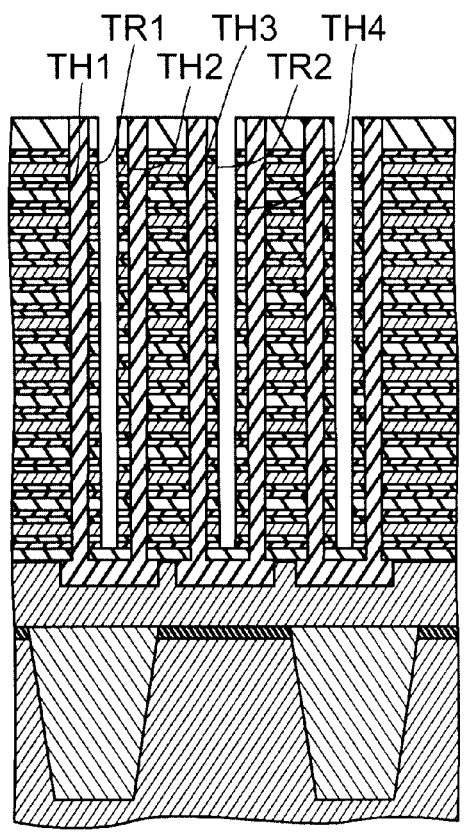

Next, as shown in FIG. 12B, trenches TR1 and TR2 dividing the interlayer insulating film 15 and the multilayer structure ML are formed between the two through holes TH1 and TH2 coupled to the first connecting portion CP1 and neighboring in the Y-axis direction and between the two through holes TH3 and TH4 coupled to the second connecting portion CP2 and neighboring in the Y-axis direction. The trenches TR1 and TR2 are formed so as to divide down to the lowermost (nearest the semiconductor substrate 11) charge storage layer 23b of the multilayer structure ML and so as not to divide the insulating films (such as the first insulating film 14 and other interlayer insulating films) between the lowermost charge storage layer 23b and the first and second connecting portions CP1 and CP2. The trenches TR1 and TR2 divide the electrode film WL into a first region WR1, a second region WR2, a third region WR3, and a fourth region WR4.

Figure 13A:
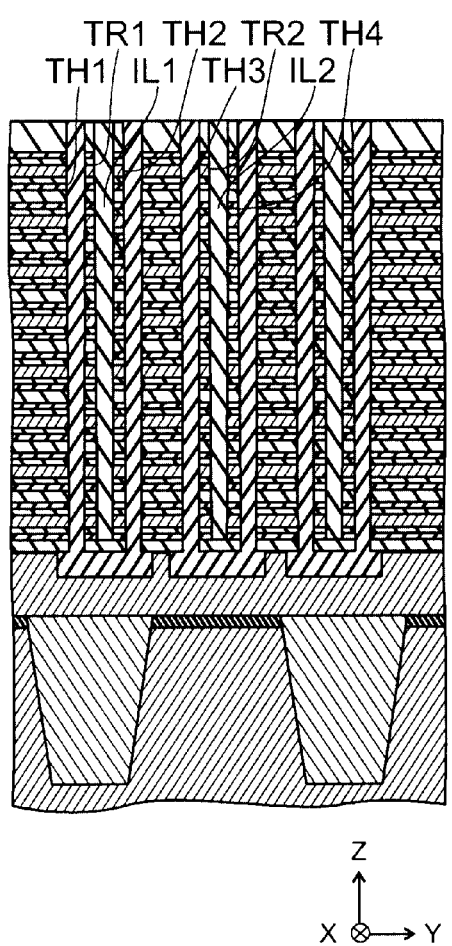
FIGS. 13A and 13B are schematic views showing processes following FIG. 12B.

Next, as shown in FIG. 13A, a silicon oxide film, for instance, is buried inside the trenches TR1 and TR2 to form a first and second dividing insulating films IL1 and IL2 respectively.

Figure 13B:
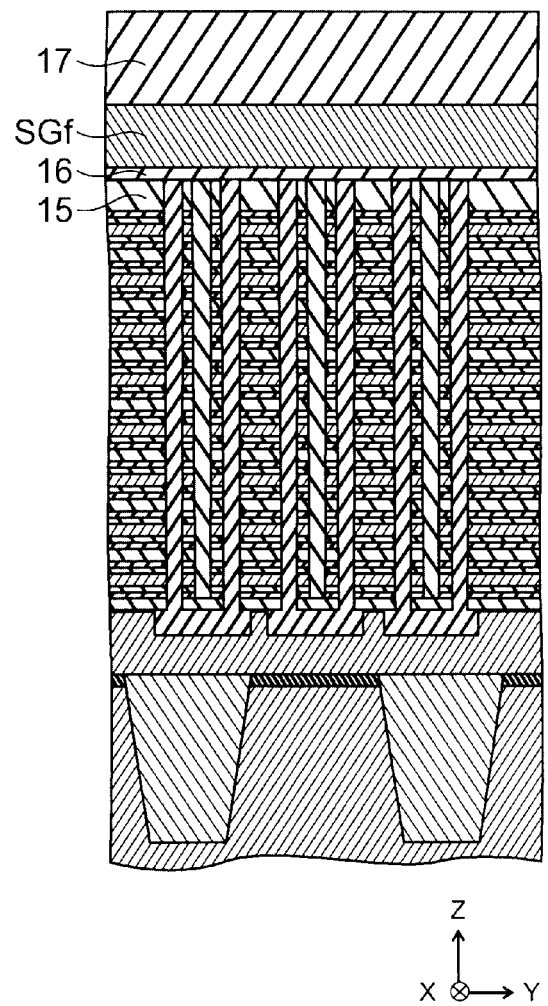

Next, as shown in FIG. 13B, an interlayer insulating film 16, a conductive film SGf to serve as select gate electrodes SG, and an interlayer insulating film 17 are formed on the interlayer insulating film 15.

Figure 14A:
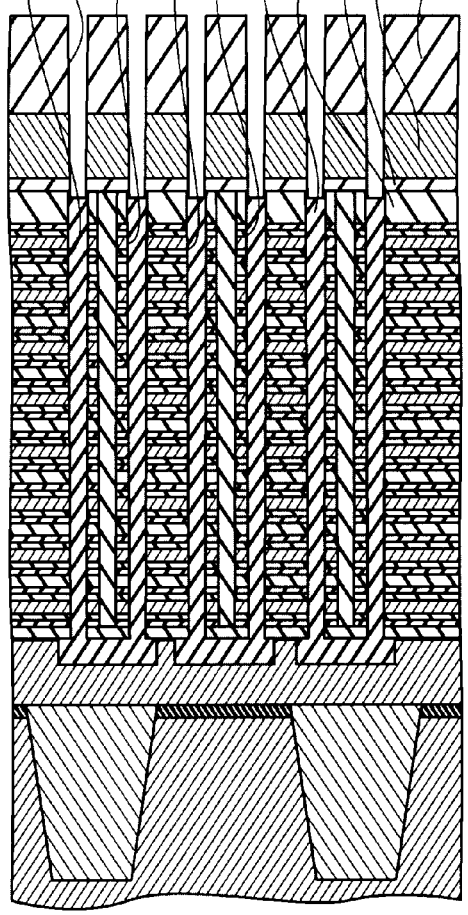
FIGS. 14A and 14B are schematic views showing processes following FIG. 13B.

Next, as shown in FIG. 14A, select gate through holes THSG penetrating through the interlayer insulating film 17, the conductive film SGf, and the interlayer insulating film 16 in the Z-axis direction and reaching the sacrificial film 72 of the through holes TH (through holes TH1, TH2, TH3, and TH4) are formed.

Figure 14B:
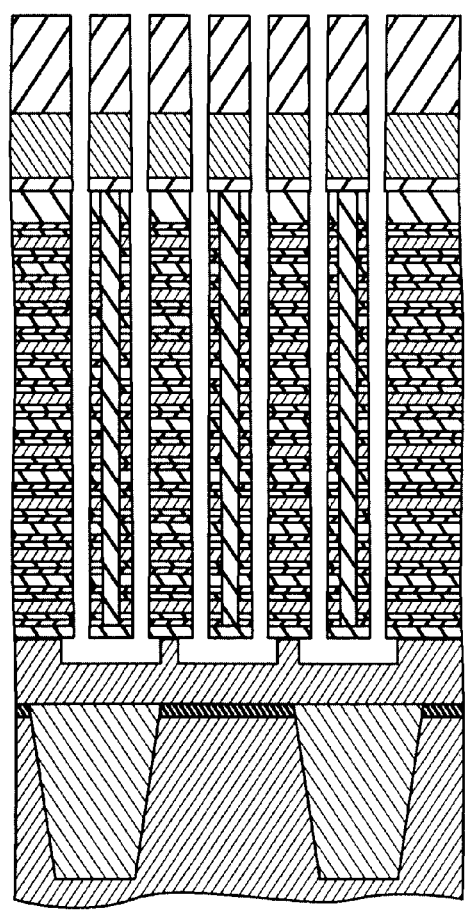

Next, as shown in FIG. 14B, the sacrificial film 72 is etched away. Here, the silicon oxide film 71 on the sidewall of the through hole TH is also removed. However, alternatively, the silicon oxide film 71 may not be removed but left till the end.

Figure 15A:
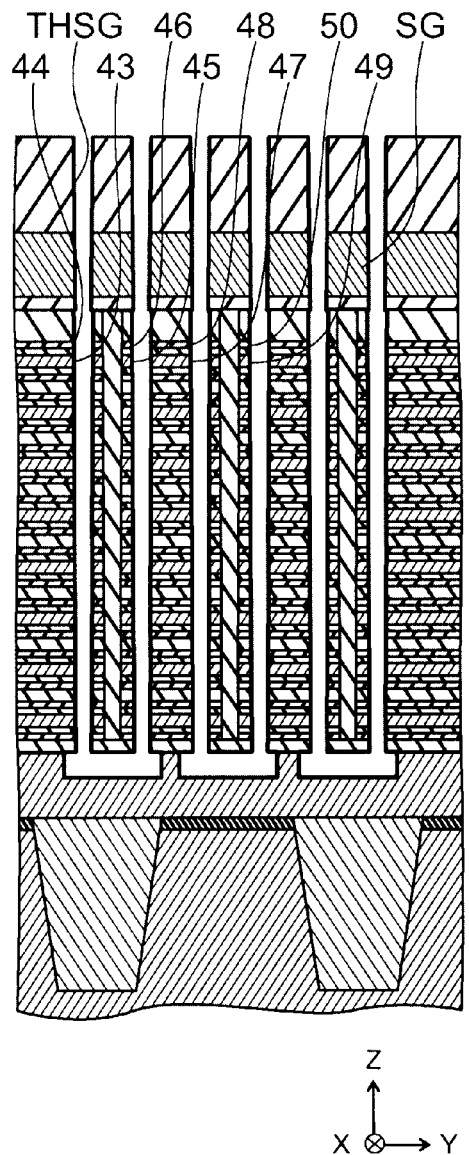
FIGS. 15A and 15B are schematic views showing processes following FIG. 14B.

Next, as shown in FIG. 15A, the electrode film WL exposed inside the through hole TH is oxidized. As a result, a third insulating film 25 (i.e., third insulating films 43, 45, 47, and 49) is formed in a portion of the electrode film WL opposed to the through hole TH. Thus, the third insulating film 25 (i.e., third insulating films 43, 45, 47, and 49) includes a portion formed by oxidation of a film to serve as the electrode film WL. Furthermore, a silicon oxide film, for instance, is formed as a fourth insulating film 22 (i.e., fourth insulating films 44, 46, 48, and 50) on the inner wall of the through hole TH.

Here, during the aforementioned oxidation of the electrode film WL, the select gate electrode SG exposed inside the select gate through hole THSG is also oxidized. Furthermore, during the aforementioned formation of the fourth insulating film 22, an insulating film is also formed on the inner wall of the select gate through hole THSG. The oxidized portion of the select gate electrode SG and the insulating film formed on the inner wall of the select gate through hole THSG constitute first to fourth gate insulating films GI1 to GI4.

Figure 15B:
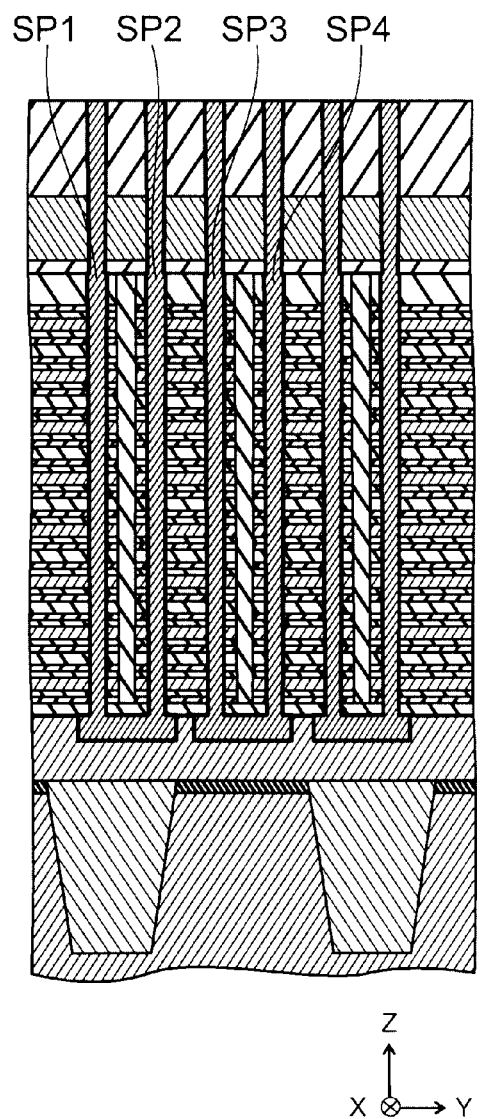

Next, as shown in FIG. 15B, amorphous silicon, for instance, is buried in the inner spaces of the through holes TH1 to TH4 to form first to fourth semiconductor pillars SP1 to SP4. Next, amorphous silicon deposited on the surface is removed by etch back.

Figure 16A:
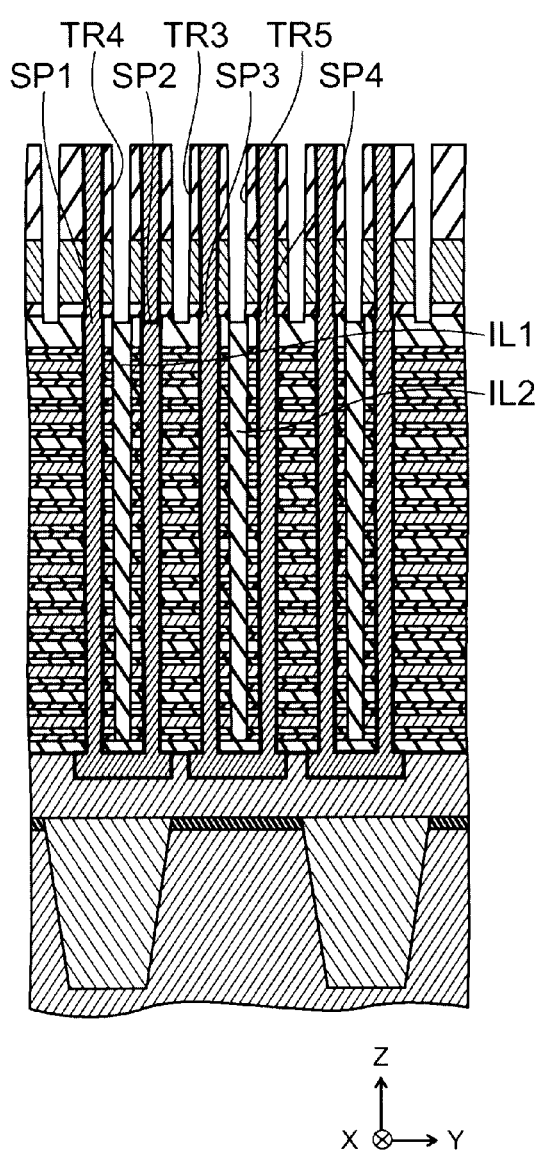
FIGS. 16A and 16B are schematic views showing processes following FIG. 15B.

Next, as shown in FIG. 16A, trenches TR4, TR3, and TR5 are formed between the first and second semiconductor pillars SP1 and SP2, between the second and third semiconductor pillars SP2 and SP3, and between the third and fourth semiconductor pillars SP3 and SP4, respectively. The trenches TR4, TR3, and TR5 are formed so as to divide the interlayer insulating film 17, the conductive film SGf, and the interlayer insulating film 16 in the Y-axis direction.

Figure 16B:
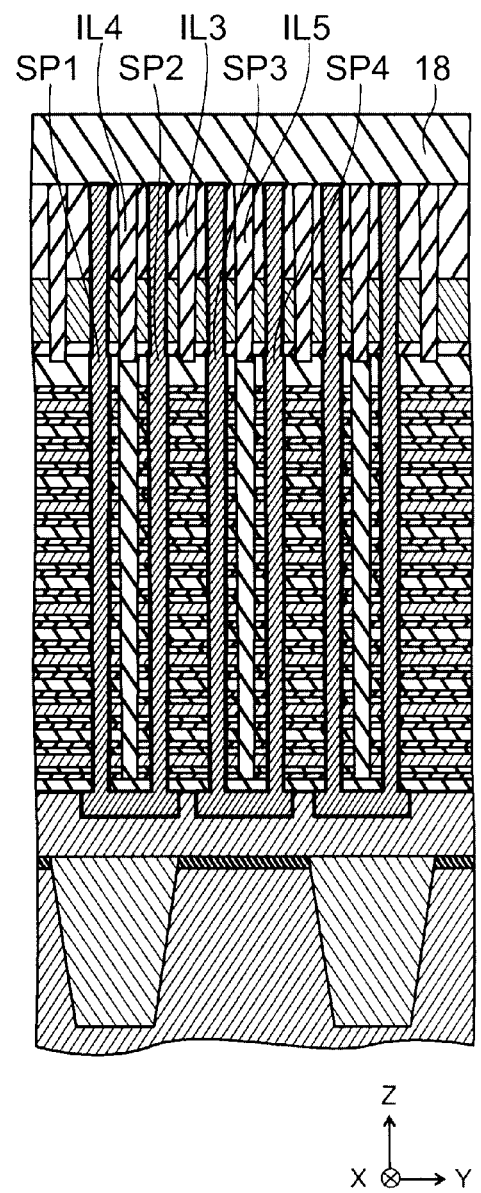

Next, as shown in FIG. 16B, a silicon oxide film, for instance, is buried inside the trenches TR3, TR4, and TR5 to form third to fifth dividing insulating films IL3 to IL5. Subsequently, a silicon oxide film, for instance, is formed thereon as an interlayer insulating film 18.

Subsequently, although not shown, a contact hole coupled to the device isolation 11b, the electrode film WL, and the select gate electrode SG is formed.

Figure 17A:
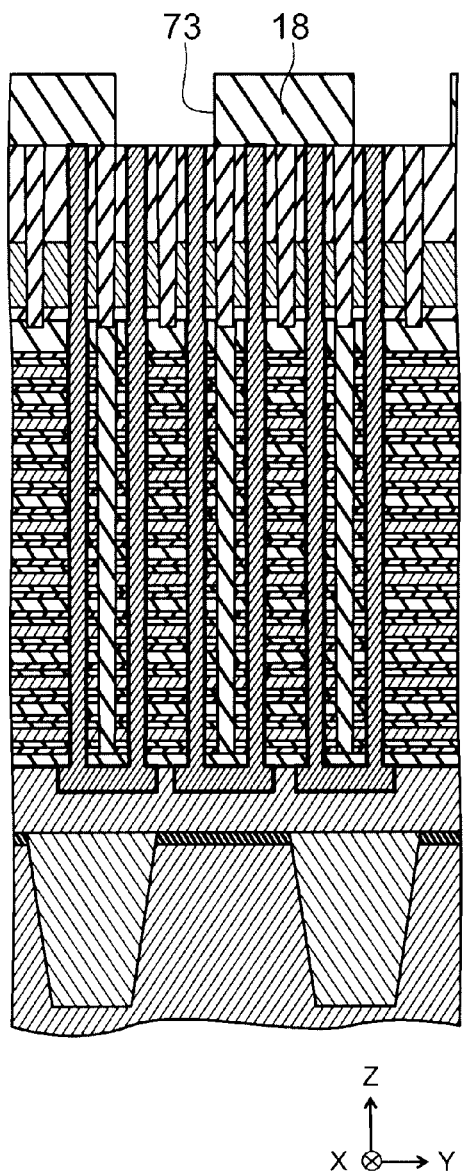
FIGS. 17A and 17B are schematic views showing processes following FIG. 16B.

Next, as shown in FIG. 17A, a groove 73 for an interconnect layer to serve as a source line SL is formed in the interlayer insulating film 18. The groove 73 is provided illustratively above the second and third semiconductor pillars SP2 and SP3. In other words, the groove 73 is formed above the semiconductor pillars corresponding to the second and third select gate electrodes SG2 and SG3.

Figure 17B:
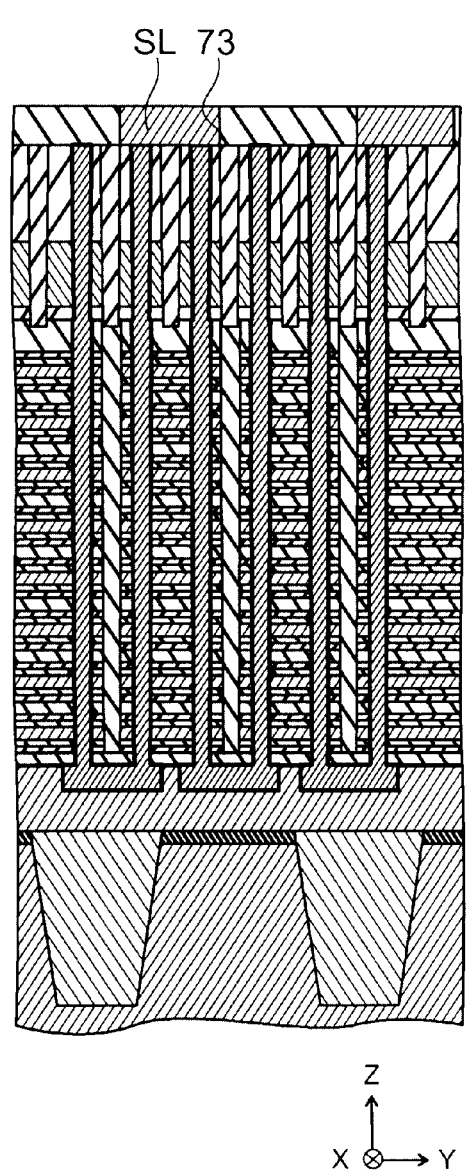

Next, as shown in FIG. 17B, a conductive material such as a metal film is buried inside the groove 73 to form a source line SL.

Figure 18A:
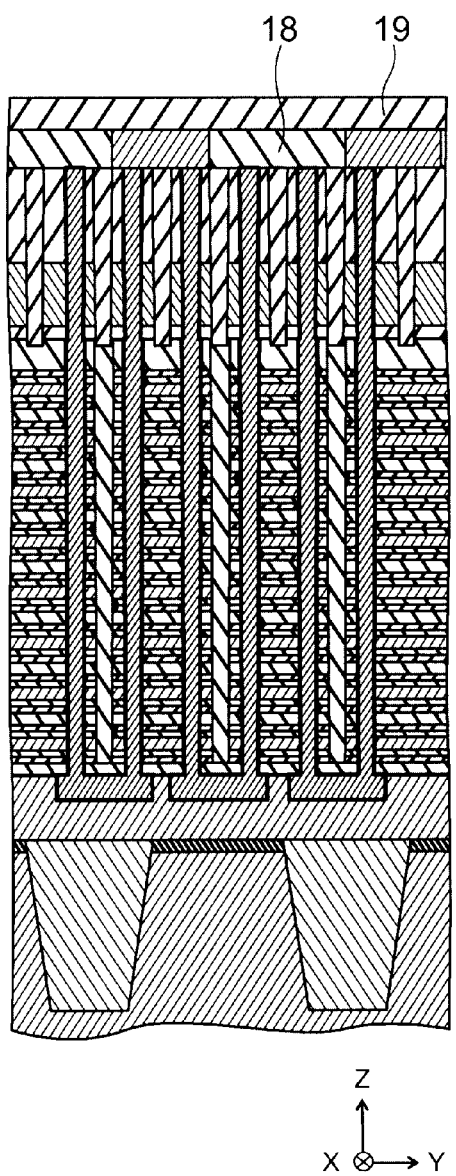
FIGS. 18A and 18B are schematic views showing processes following FIG. 17B.

Next, as shown in FIG. 18A, an interlayer insulating film 19 is formed on the interlayer insulating film 18.

Figure 18B:
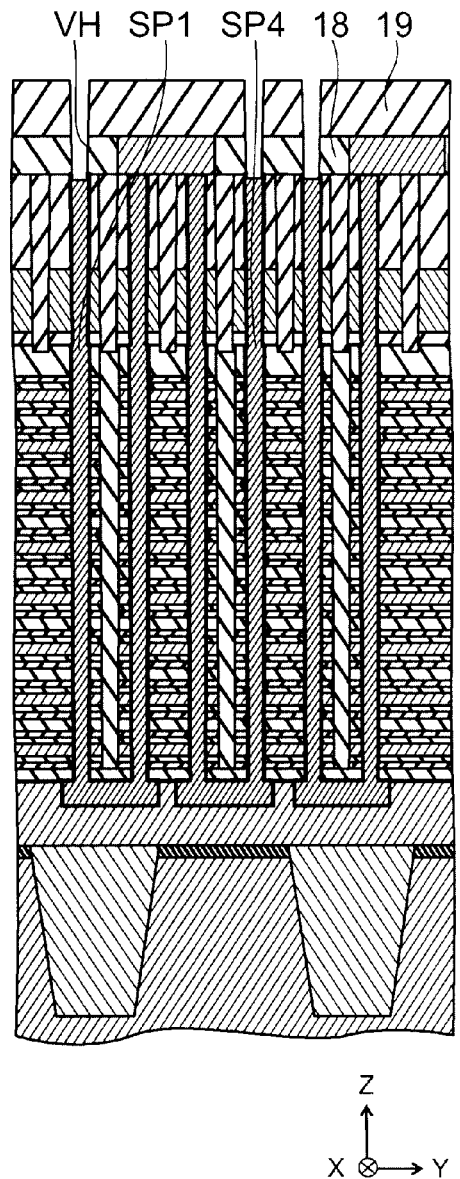

Next, as shown in FIG. 18B, via holes VH are formed in the interlayer insulating films 18 and 19. The via holes VH are formed illustratively at positions corresponding to the first and fourth semiconductor pillars SP1 and SP4.

Figure 19A:
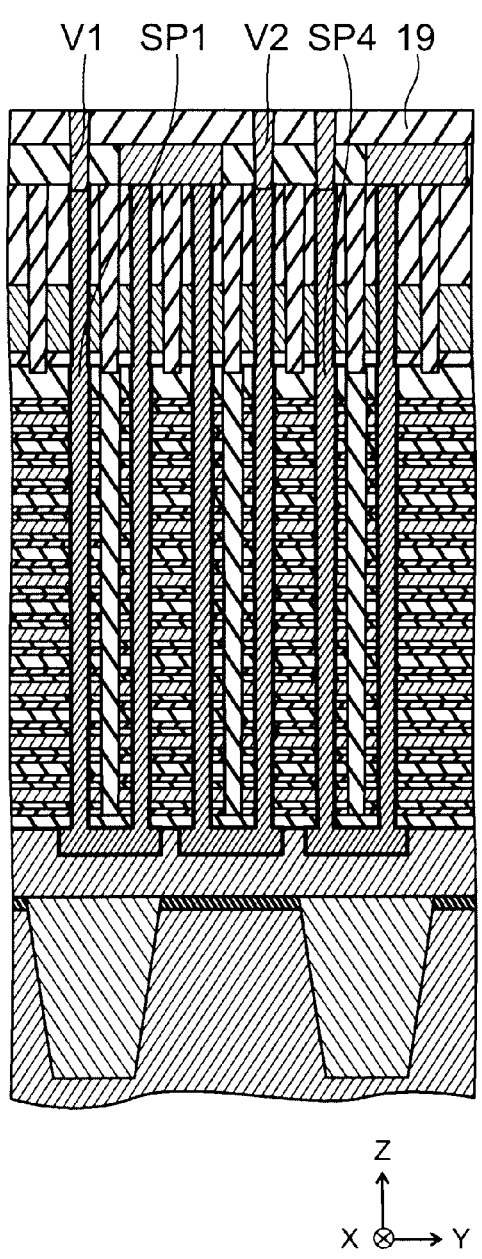
FIGS. 19A and 19B are schematic views showing processes following FIG. 18B.

Next, as shown in FIG. 19A, a conductive material such as a metal film is buried inside the via hole VH to form a first and second vias V1 and V2, coupled to the first and fourth semiconductor pillars SP1 and SP4, respectively.

Figure 19B:
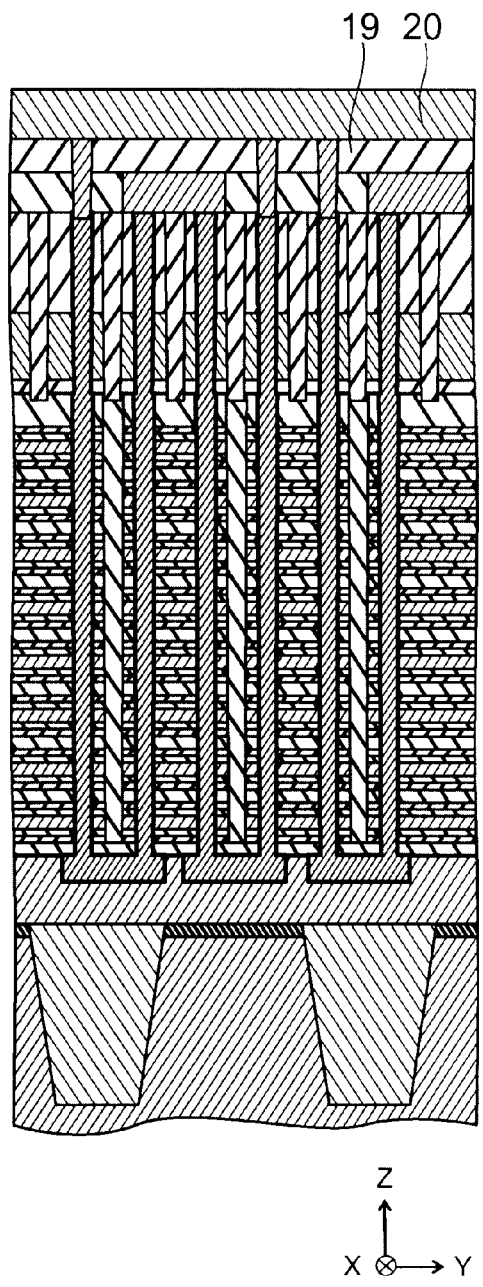

Next, as shown in FIG. 19B, an interlayer insulating film 20 is formed on the interlayer insulating film 19 and on the first and second vias V1 and V2.

Figure 20A:
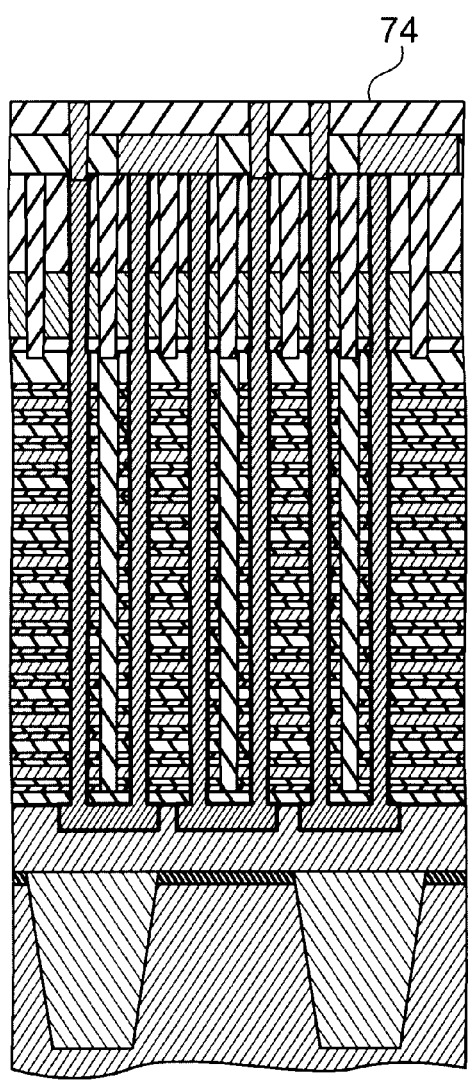
FIGS. 20A and 20B are schematic views showing processes following FIG. 19B.

Next, as shown in FIG. 20A, a groove 74 for an interconnect layer to serve as a bit line BL is formed in the interlayer insulating film 20. The groove 74 extends in the Y-axis direction.

Figure 20B:
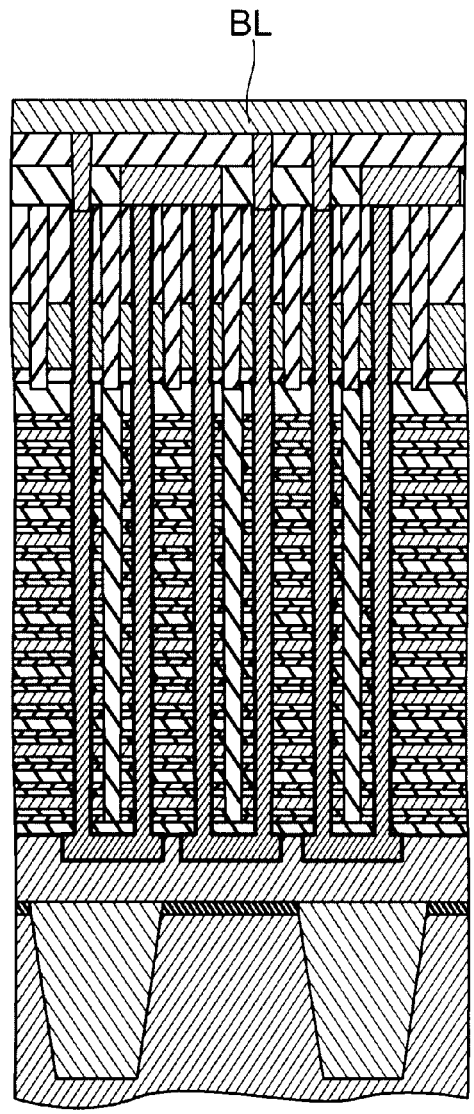

Next, as shown in FIG. 20B, a conductive material such as a metal film is buried inside the groove 74 to form a bit line BL. Thus, the nonvolatile semiconductor memory device 121 illustrated in FIGS. 8 and 9 can be formed.

As described above, the nonvolatile semiconductor memory device 121 is a nonvolatile semiconductor memory device enabling higher density packaging and achieving good performance without interference between neighboring electrode films WL.

Second Embodiment

Figure 21:
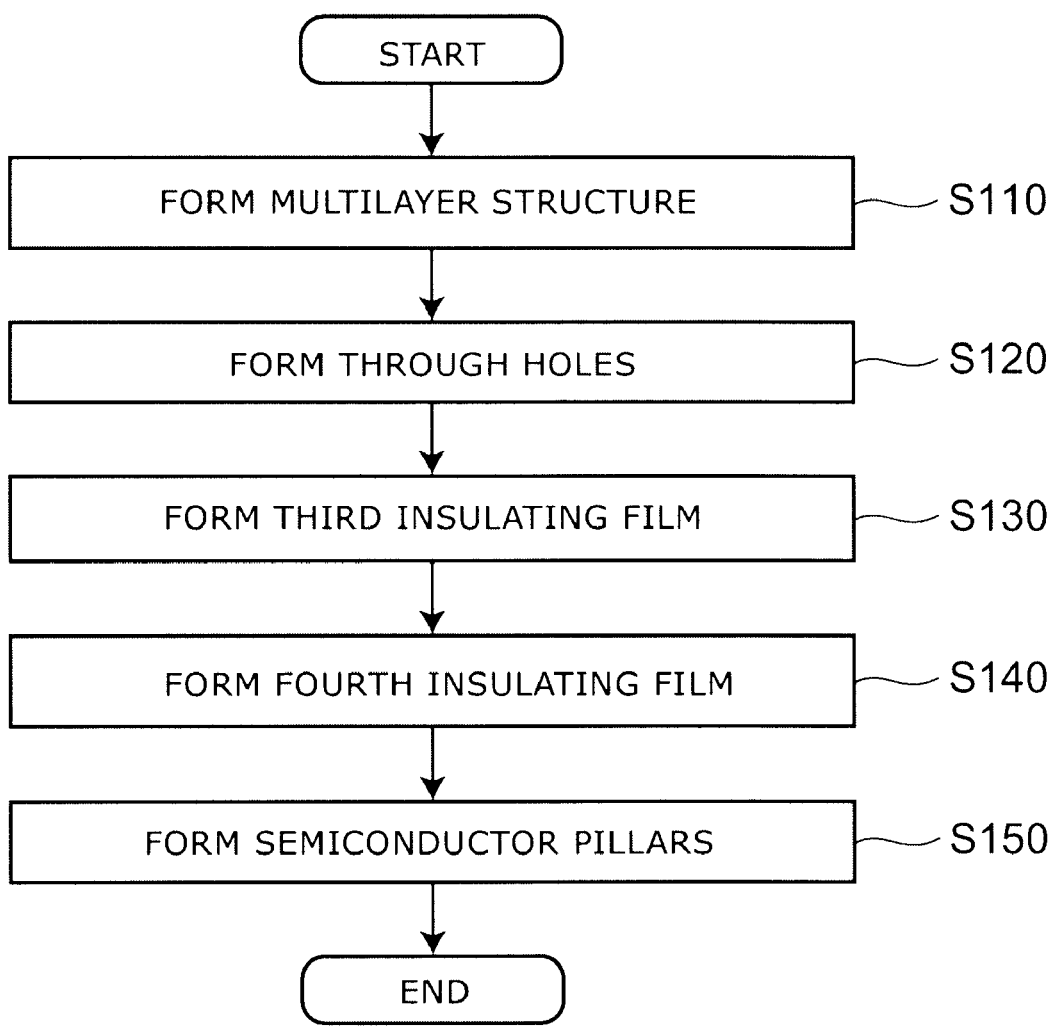
FIG. 21 is a flow chart illustrating a method for manufacturing a nonvolatile semiconductor memory device according to a second embodiment of the invention.

The second embodiment of the invention relates to a method for manufacturing a nonvolatile semiconductor memory device. FIG. 21 is a flow chart illustrating the method for manufacturing a nonvolatile semiconductor memory device according to the second embodiment of the invention.

As shown in FIG. 21, in the method for manufacturing a nonvolatile semiconductor memory device according to the second embodiment of the invention, first, a plurality of constituent multilayer bodies ML1, each including an electrode film WL, a second insulating film, a charge storage layer, and a first insulating film 14, are formed on the major surface 11a of a substrate (e.g., semiconductor substrate 11) to form a multilayer structure ML (step S110).

More specifically, this process is a process for forming the multilayer structure ML performed on the major surface of the substrate, which repeats multiple times the process for forming the constituent multilayer body ML1 including the process for stacking the electrode film WL, the process for stacking the first insulating film 14, the process for stacking the charge storage layer performed between the process for stacking the electrode film WL and the process for stacking the first insulating film 14, and the process for stacking the second insulating film performed between the process for stacking the electrode film WL and the process for stacking the charge storage layer.

The second insulating film can be at least one of the aforementioned second insulating films 24a and 24b, and the charge storage layer can be at least one of the aforementioned charge storage layers 23a and 23b.

In the case where the charge storage layers are formed above and below the electrode film WL, the process for forming the constituent multilayer body ML1 further includes the process for stacking a second-layer charge storage layer performed in reverse order to the stacking processes on the first insulating film 14 side of the electrode film WL, and the process for stacking a second-layer second insulating film performed between the process for stacking the second-layer charge storage layer and the process for stacking the electrode film WL. Thus, the forming the constituent multilayer body further includes stacking another charge storage layer (the second-layer charge storage layer) performed in reverse order to the stacking on the first insulating film side of the electrode film; and stacking another second insulating film (the second-layer second insulating film) performed between the stacking the another charge storage layer and the stacking the electrode film WL. Step S110 can illustratively be based on the method described with reference to FIG. 10B.

Next, through holes TH penetrating through the multilayer structure ML in the Z-axis direction perpendicular to the major surface 11a are formed (step S120). This can illustratively be based on the method described with reference to FIG. 11A.

Next, the electrode film WL exposed to the inner surface of the through hole TH is oxidized to form a third insulating film (step S130). This can illustratively be based on the method described with reference to FIG. 15A. Here, the third insulating film corresponds to the aforementioned third insulating films 43 (25), 45, 47, and 49.

Next, a fourth insulating film 22 is formed on the inner wall of the through hole TH (step S140). This can illustratively be based on the method described with reference to FIG. 15A. Here, the fourth insulating film corresponds to the aforementioned fourth insulating films 44 (22), 46, 48, and 50.

Next, a semiconductor material is buried in the remaining space inside the through hole TH to form a semiconductor pillar SP (step S150). This can illustratively be based on the method described with reference to FIG. 15B.

As described earlier, the fourth insulating film 22 is provided also on the through hole TH side of the third insulating film 25. Thus, the distance t1 between the semiconductor pillar SP and the electrode film WL in the direction parallel to the major surface 11a can be made longer than the distance t2 between the semiconductor pillar SP and the charge storage layer 23a, and it allows stable operation in the nonvolatile semiconductor memory device.

The method for manufacturing a nonvolatile semiconductor memory device according to this embodiment can provide a method for manufacturing a nonvolatile semiconductor memory device enabling higher density packaging.

In addition, the process for stacking the constituent multilayer body ML1 can be the process for stacking the electrode film WL, the second insulating film 24a, the charge storage layer 23a, the first insulating film 14, the second-layer charge storage layer 23b, and the second-layer second insulating film 24b sequentially in this order. This can realize a structure in which charge storage layers are placed above and below the electrode film WL.

Furthermore, before the formation of the multilayer structure ML, a connecting portion (e.g., first connecting portion CP1) connected to two neighboring ones of the semiconductor pillars (e.g., first and second semiconductor pillars SP1 and SP2) can be formed on the substrate. Thus, the coupling portion of a U-shaped NAND string can be formed.

Furthermore, a trench dividing the multilayer structure ML by a plane including the X-axis and Z-axis directions can be further formed between two of the semiconductor pillars (e.g., first and second semiconductor pillars SP1 and SP2) neighboring in the Y-axis direction, which is in a plane parallel to the major surface 11a, and an insulating material can be buried inside this trench to form a dividing insulating layer (e.g., first dividing insulating layer IL1). Thus, a U-shaped NAND string can be formed. Thus the method may includes forming a trench dividing the multilayer structure ML between two of the through holes neighboring in a second direction by a plane including the first direction and a third direction, the second direction being in a plane parallel to the major surface, the third direction being orthogonal to the first direction and the second direction, and burying an insulating material inside the trench.

In this specification, the term "perpendicular" and "parallel" mean not only being exactly perpendicular and exactly parallel, but include, for instance, variations in the manufacturing process, and only need to mean substantially perpendicular and substantially parallel.

The embodiments of the invention have been described with reference to examples. However, the invention is not limited to these examples. For instance, various specific configurations of the components, such as the semiconductor substrate, electrode film, insulating film, insulating layer, constituent multilayer body, multilayer structure, charge storage layer, through hole, semiconductor pillar, word line, bit line, and source line, constituting the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile semiconductor memory device and the method for manufacturing the same described above in the embodiments of the invention, and all the nonvolatile semiconductor memory devices and the methods for manufacturing the same thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention. For instance, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A nonvolatile semiconductor memory device comprising: a semiconductor substrate; a multilayer structure provided on the semiconductor substrate and including a plurality of constituent multilayer bodies stacked on top of one another in a first direction perpendicular to a major surface of the semiconductor substrate, each of the plurality of constituent multilayer bodies including an electrode film provided parallel to the major surface, a first insulating film, a charge storage layer provided between the electrode film and the first insulating film, and a second insulating film provided between the charge storage layer and the electrode film; a first semiconductor pillar having a portion with a homogeneous width that penetrates through the multilayer structure in the first direction; a third insulating film provided between the first semiconductor pillar and the electrode film; a fourth insulating film provided between the first semiconductor pillar and the charge storage layer; a second semiconductor pillar neighboring the first semiconductor pillar in a second direction perpendicular to the first direction and penetrating through the multilayer structure in the first direction; a fifth insulating film provided between the second semiconductor pillar and the electrode film; and a sixth insulating film provided between the second semiconductor pillar and the charge storage layer.

2. The device according to claim 1, wherein a distance between the first semiconductor pillar and the electrode film in a direction parallel to the major surface is longer than a distance between the first semiconductor pillar and the charge storage layer.

3. The device according to claim 1, wherein an electric field applied between the first semiconductor pillar and the electrode film is lower than an electric field applied between the first semiconductor pillar and the charge storage layer.

4. The device according to claim 1, wherein the fourth insulating film extends between the first semiconductor pillar and at least one of the first insulating film, the second insulating film, and the third insulating film.

5. The device according to claim 1, wherein the third insulating film includes a portion formed by oxidation of a film to serve as the electrode film.

6. The device according to claim 1, wherein a length of the second insulating film along the first direction is shorter than a length of the first insulating film along the first direction.

7. The device according to claim 1, wherein a length of the fourth insulating film along a direction orthogonal to the first direction is shorter than a length of the first insulating film along the first direction.

8. The device according to claim 1, wherein a length of the third insulating film along a direction orthogonal to the first direction is shorter than a length of the first insulating film along the first direction.

9. The device according to claim 1, wherein in each of the constituent multilayer bodies, the charge storage layer is provided both above and below the electrode film, and the second insulating film is provided between the electrode film and each of the charge storage layers provided above and below the electrode film.

10. A nonvolatile semiconductor memory device comprising: a semiconductor substrate; a multilayer structure provided on the semiconductor substrate and including a plurality of constituent multilayer bodies stacked on top of one another in a first direction perpendicular to a major surface of the semiconductor substrate, each of the plurality of constituent multilayer bodies including an electrode film provided parallel to the major surface, a first insulating film, a charge storage layer provided between the electrode film and the first insulating film, and a second insulating film provided between the charge storage layer and the electrode film; a first semiconductor pillar having a portion with a homogeneous width that penetrates through the multilayer structure in the first direction; a third insulating film provided between the first semiconductor pillar and the electrode film; a fourth insulating film provided between the first semiconductor pillar and the charge storage layer; a second semiconductor pillar neighboring the first semiconductor pillar in a second direction perpendicular to the first direction and penetrating through the multilayer structure in the first direction; a fifth insulating film provided between the second semiconductor pillar and the electrode film; a sixth insulating film provided between the second semiconductor pillar and the charge storage layer; a first connecting portion electrically connecting between the first semiconductor pillar and the second semiconductor pillar on the semiconductor substrate side; a bit line extending in the second direction and connected to a first end portion of the first semiconductor pillar located on a opposite side from the semiconductor substrate; and a source line extending in a third direction orthogonal to the first direction and the second direction and connected to a second end portion of the second semiconductor pillar located on the opposite side from the semiconductor substrate.

11. The device according to claim 10, wherein the first connecting portion is made of the same material as the first semiconductor pillar and the second semiconductor pillar.

12. The device according to claim 10, further comprising:
a first dividing insulating layer provided between the first semiconductor pillar and the second semiconductor pillar and dividing the electrode film into a first region facing the first semiconductor pillar and a second region facing the second semiconductor pillar.

13. The device according to claim 10, further comprising:
a first select gate electrode and a second select gate electrode extending in the third direction orthogonal to the first direction and the second direction on the opposite side of the multilayer structure from the semiconductor substrate, the first select gate electrode and the second select gate electrode being respectively penetrated by the first semiconductor pillar and the second semiconductor pillar;
a first gate insulating film provided between the first semiconductor pillar and the first select gate electrode; and
a second gate insulating film provided between the second semiconductor pillar and the second select gate electrode.

14. The device according to claim 10, further comprising:
a third semiconductor pillar neighboring the second semiconductor pillar in the second direction on the opposite side of the second semiconductor pillar from the first semiconductor pillar and penetrating through the multilayer structure in the first direction;
a seventh insulating film provided between the third semiconductor pillar and the electrode film;
an eighth insulating film provided between the third semiconductor pillar and the charge storage layer;
a fourth semiconductor pillar neighboring the third semiconductor pillar on the opposite side of the third semiconductor pillar from the second semiconductor pillar in the second direction and penetrating through the multilayer structure in the first direction;
a ninth insulating film provided between the fourth semiconductor pillar and the electrode film;
a tenth insulating film provided between the fourth semiconductor pillar and the charge storage layer; and
a second connecting portion electrically connecting between the third semiconductor pillar and the fourth semiconductor pillar on the semiconductor substrate side,
the bit line being connected to a fourth end portion of the fourth semiconductor pillar located on the opposite side from the semiconductor substrate, and
the source line being connected to a third end portion of the third semiconductor pillar located on the opposite side from the semiconductor substrate.

15. The device according to claim 14, further comprising:
a second dividing insulating layer provided between the third semiconductor pillar and the fourth semiconductor pillar and dividing the electrode film into a third region facing the third semiconductor pillar and a fourth region facing the fourth semiconductor pillar;
a third select gate electrode and a fourth select gate electrode extending in the third direction on the opposite side of the multilayer structure from the semiconductor substrate, the third select gate electrode and the fourth select gate electrode being respectively penetrated by the third semiconductor pillar and the fourth semiconductor pillar;
a third gate insulating film provided between the third semiconductor pillar and the third select gate electrode; and
a fourth gate insulating film provided between the fourth semiconductor pillar and the fourth select gate electrode.

16. The device according to claim 15, further comprising:
a third dividing insulating layer provided between the second select gate electrode and the third select gate electrode.

* * * * *